(12) United States Patent
Kanamori et al.

(10) Patent No.: US 11,211,402 B2
(45) Date of Patent: Dec. 28, 2021

(54) THREE-DIMENSIONAL SEMICONDUCTOR MEMORY DEVICE

(71) Applicant: SAMSUNG ELECTRONICS CO., LTD., Suwon-si (KR)

(72) Inventors: Kohji Kanamori, Seoul (KR); Seo-Goo Kang, Seoul (KR); Younghwan Son, Hwaseong-si (KR); Kwonsoon Jo, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 16/750,176

(22) Filed: Jan. 23, 2020

(65) Prior Publication Data

US 2020/0161330 A1 May 21, 2020

Related U.S. Application Data

(63) Continuation of application No. 16/018,199, filed on Jun. 26, 2018, now Pat. No. 10,566,345.

(30) Foreign Application Priority Data

Nov. 7, 2017 (KR) .................... 10-2017-0147522

(51) Int. Cl.
*H01L 27/11* (2006.01)
*H01L 27/11582* (2017.01)
(Continued)

(52) U.S. Cl.
CPC .......... *H01L 27/11582* (2013.01); *G11C 8/14* (2013.01); *H01L 27/1157* (2013.01);
(Continued)

(58) Field of Classification Search
CPC . G11C 8/14; H01L 27/11565; H01L 27/1157; H01L 27/11573; H01L 27/11575; H01L 27/11582
See application file for complete search history.

(56) References Cited

U.S. PATENT DOCUMENTS 9,190,614 B2 11/2015 Lee et al.
9,431,415 B2 8/2016 Shin et al.
(Continued)

FOREIGN PATENT DOCUMENTS

CN 106920794 7/2017
JP 2010-034109 2/2012

*Primary Examiner* — Mohammed Shamsuzzaman
(74) *Attorney, Agent, or Firm* — F. Chau & Associates, LLC

(57) ABSTRACT

A three-dimensional semiconductor memory device includes a peripheral logic structure on a semiconductor substrate. A horizontal semiconductor layer is on the peripheral logic structure and includes a cell array region and a connection region. Electrode structures extend in a first direction on the horizontal semiconductor layer and are spaced apart in a second direction intersecting the first direction. A pair of the electrode structures adjacent to each other are symmetrically disposed to define a contact region partially exposing the horizontal semiconductor layer. A through via structure is on the contact region and connects the electrode structures to the peripheral logic structure. Each of the electrode structures includes a plurality of gate insulation regions extending along the first direction on the connection region. The gate insulation regions have different lengths from each other in the first direction.

18 Claims, 32 Drawing Sheets

(51) Int. Cl.
  H01L 27/1157 (2017.01)
  H01L 27/11573 (2017.01)
  H01L 27/11565 (2017.01)
  H01L 27/11575 (2017.01)
  G11C 8/14 (2006.01)

(52) U.S. Cl.
  CPC .. H01L 27/11565 (2013.01); H01L 27/11573 (2013.01); H01L 27/11575 (2013.01)

(56) References Cited

U.S. PATENT DOCUMENTS

| | | | |
|---|---|---|---|
| 9,564,451 B1 | 2/2017 | Shin et al. | |
| 9,589,978 B1 | 3/2017 | Yip | |
| 9,595,533 B2 | 3/2017 | Tanzawa et al. | |
| 9,659,950 B2* | 5/2017 | Yip | G11C 16/06 |
| 9,659,959 B2* | 5/2017 | Lee | H01L 29/40117 |
| 9,691,782 B1* | 6/2017 | Hwang | H01L 27/1157 |
| 9,818,693 B2* | 11/2017 | Toyama | H01L 23/5283 |
| 10,170,570 B1* | 1/2019 | Sonehara | H01L 27/1157 |
| 2002/0175364 A1* | 11/2002 | Ichige | H01L 27/115 257/314 |
| 2009/0135639 A1* | 5/2009 | Hirose | H01L 27/0207 365/72 |
| 2010/0020608 A1* | 1/2010 | Kamigaichi | G11C 5/025 365/185.05 |
| 2010/0044846 A1* | 2/2010 | Ohmi | H01L 27/0688 257/686 |
| 2012/0083077 A1* | 4/2012 | Yang | H01L 27/11582 438/156 |
| 2012/0211823 A1* | 8/2012 | Lim | H01L 27/11565 257/326 |
| 2013/0187118 A1* | 7/2013 | Murooka | H01L 45/16 257/4 |
| 2014/0104948 A1* | 4/2014 | Rhie | G11C 16/0483 365/185.11 |
| 2015/0340376 A1* | 11/2015 | Park | H01L 27/11582 257/329 |
| 2015/0372005 A1* | 12/2015 | Yon | H01L 27/11573 257/5 |
| 2016/0071908 A1* | 3/2016 | Murooka | H01L 45/1226 257/4 |
| 2016/0247570 A1* | 8/2016 | Chang | G11C 16/08 |
| 2016/0268288 A1* | 9/2016 | Fukuzumi | H01L 27/11582 |
| 2016/0322376 A1 | 11/2016 | Lee | |
| 2017/0047344 A1 | 2/2017 | Lee et al. | |
| 2017/0062327 A1 | 3/2017 | Kim et al. | |
| 2017/0077230 A1* | 3/2017 | Ikeda | H01L 27/11582 |
| 2017/0141121 A1 | 5/2017 | Freeman et al. | |
| 2017/0200676 A1 | 7/2017 | Jeong et al. | |
| 2017/0207232 A1 | 7/2017 | You et al. | |
| 2017/0236836 A1* | 8/2017 | Huo | H01L 28/00 257/324 |
| 2017/0250194 A1* | 8/2017 | Lee | H01L 27/1157 |
| 2017/0301684 A1* | 10/2017 | Park | H01L 27/11526 |
| 2018/0076210 A1* | 3/2018 | Hamada | H01L 27/11575 |
| 2018/0350831 A1* | 12/2018 | Kim | G11C 11/4099 |
| 2018/0358371 A1* | 12/2018 | Hwang | H01L 27/11575 |
| 2019/0035807 A1* | 1/2019 | Kim | H01L 27/11556 |
| 2019/0043883 A1* | 2/2019 | Xu | H01L 23/528 |
| 2019/0139979 A1 | 5/2019 | Kanamori et al. | |

* cited by examiner

FIG. 22

THREE-DIMENSIONAL SEMICONDUCTOR MEMORY DEVICE

CROSS-REFERENCE TO RELATED APPLICATION

This U.S. nonprovisional patent application is a continuation of U.S. patent application Ser. No. 16/018,199 filed on Jun. 26, 2018, which claims priority under 35 U.S.C § 119 to Korean Patent Application No. 10-2017-0147522 filed on Nov. 7, 2017, the disclosures of which are incorporated by reference herein in their entireties.

TECHNICAL FIELD

Exemplary embodiments of the present inventive concept relate to a memory device, and more particularly to a three-dimensional semiconductor memory device.

DISCUSSION OF RELATED ART

Semiconductor devices may be relatively highly integrated and may be manufactured at relatively low manufacturing costs. Integration density of semiconductor devices may be a factor in determining product price. Integration of typical two-dimensional or planar semiconductor devices may be determined by the area occupied by a unit memory cell, and thus integration of two-dimensional or planar semiconductor devices may be influenced by the level of technology for forming fine patterns. Processing equipment used to increase pattern fineness may limit integration density of the two-dimensional or planar semiconductor devices. Three-dimensional semiconductor memory devices may have three-dimensionally arranged memory cells.

SUMMARY

An exemplary embodiment of the present inventive concept provides a three-dimensional semiconductor memory device having increased reliability and integration.

According to an exemplary embodiment of the present inventive concept, a three-dimensional semiconductor memory device includes a peripheral logic structure on a semiconductor substrate. A horizontal semiconductor layer is on the peripheral logic structure and includes a cell array region and a connection region. Electrode structures extend in a first direction on the horizontal semiconductor layer and are spaced apart in a second direction intersecting the first direction. A pair of the electrode structures adjacent to each other are symmetrically disposed to define a contact region partially exposing the horizontal semiconductor layer. A through via structure is on the contact region and connects the electrode structures to the peripheral logic structure. Each of the electrode structures include a plurality of gate insulation regions extending along the first direction on the connection region. The gate insulation regions have different lengths from each other in the first direction.

According to an exemplary embodiment of the present inventive concept, a three-dimensional semiconductor memory device includes a peripheral logic structure on a semiconductor substrate. A horizontal semiconductor layer is on the peripheral logic structure and includes a cell array region and a connection region. Electrode structures extend in a first direction on the horizontal semiconductor layer and are spaced apart in a second direction intersecting the first direction. A through via structure penetrates the electrode structures and the horizontal semiconductor layer. The through via structure connects the electrode structures to the peripheral logic structure. Each of the electrode structures include first gate insulation regions extending in the first direction on the cell array region and spaced apart from each other at a first interval. Each of the electrode structures include second gate insulation regions extending in the first direction on the connection region and spaced apart from each other at a second interval less than the first interval.

According to an exemplary embodiment of the present inventive concept, a three-dimensional semiconductor memory device includes a peripheral logic structure on a semiconductor substrate. A horizontal semiconductor layer is on the peripheral logic structure and includes a cell array region and a connection region. Electrode structures extend in a first direction on the horizontal semiconductor layer and are spaced apart in a second direction intersecting the first direction. Each of the electrode structures include first gate insulation regions extending in the first direction on the cell array region and spaced apart from each other at a first interval. Each of the electrode structures include second gate insulation regions spaced apart from the first gate insulation regions and extending in the first direction on the connection region. The second gate insulation regions are spaced apart from each other at a second interval less than the first interval. Gate openings are provided between ground select gate electrodes in the second direction and between the first gate insulation regions and the second gate insulation regions in the first direction. The ground select gate electrodes are spaced apart from each other in the second direction at a same level from the horizontal semiconductor layer.

According to an exemplary embodiment of the present inventive concept, a three-dimensional semiconductor memory device includes a peripheral logic structure on a semiconductor substrate. A horizontal semiconductor layer is on the peripheral logic structure and includes a cell array region and a connection region. A through via structure partially penetrates the horizontal semiconductor layer on the connection region. An electrode structure is on the horizontal semiconductor layer and extends in a first direction. A portion of the electrode structure surrounds the through via structure on the connection region. The electrode structure includes a plurality of ground select gate electrodes separated from each other in a second direction crossing the first direction at a same level from the horizontal semiconductor layer as each other. Each of the ground select gate electrodes have a first width on the cell array region and a second width on an area adjacent to the through via structure. The second width is less than the first width.

According to an exemplary embodiment of the present inventive concept, a semiconductor memory device includes a semiconductor substrate including a cell array region and a connection region. A peripheral logic structure is disposed on the semiconductor substrate. A plurality of ground select lines are stacked in the cell array region. The ground select lines are spaced apart from each other by first insulating layers. A plurality of word lines are stacked on the ground select lines in the cell array region. The word lines are spaced apart from each other by second insulating layers. The plurality of word lines form a stepped structure. A vertical structure penetrates the plurality of word lines and the plurality of ground select lines. The vertical structure is connected to a lowermost ground select line of the plurality of ground select lines. A through via structure is in the connection region. The through via structure connects the plurality of ground select lines and the plurality of word lines to the peripheral logic structure.

BRIEF DESCRIPTION OF THE DRAWINGS

The above and other features of the inventive concept will become more apparent by describing in detail exemplary embodiments thereof, with reference to the accompanying drawings, in which:

FIGS. 17A, 18A, 19A, 20A, 21, and 22 are cross-sectional views of a method of manufacturing a three-dimensional semiconductor memory device according to an exemplary embodiment of the present inventive concept.

DETAILED DESCRIPTION OF EMBODIMENTS

Figure 1:
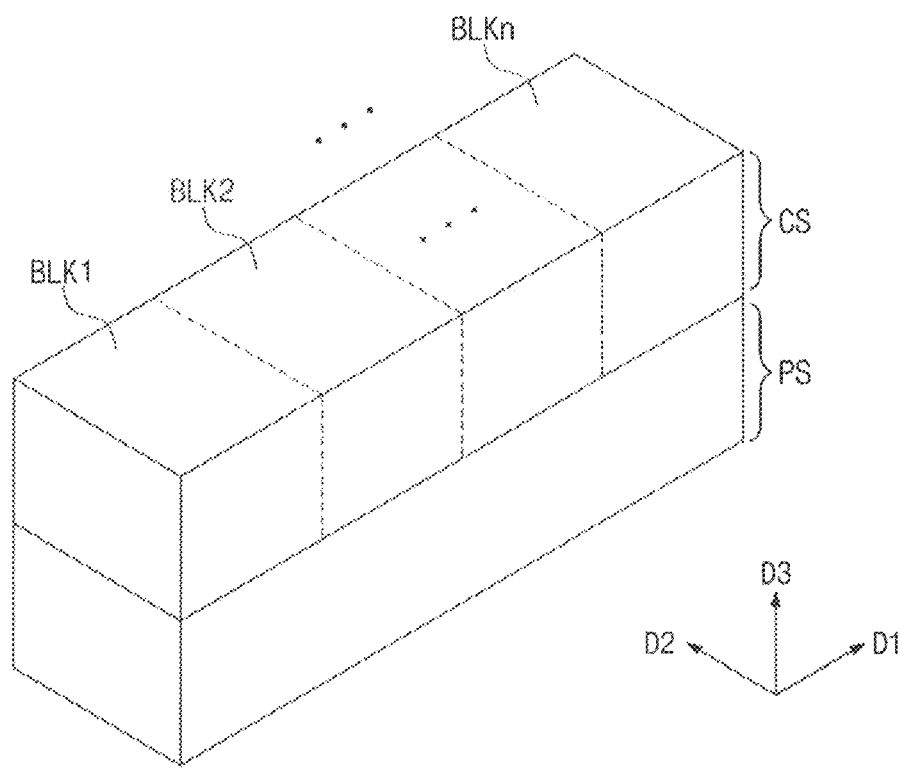
FIG. 1 is a perspective view of a three-dimensional semiconductor memory device according to an exemplary embodiment of the present inventive concept.

Exemplary embodiments of the present inventive concept will be described below in more detail below with reference to the accompanying drawings. Like reference numerals may refer to like elements throughout the specification and drawings.

FIG. 1 is a perspective view of a three-dimensional semiconductor memory device according to an exemplary embodiment of the present inventive concept.

Referring to FIG. 1, a three-dimensional semiconductor memory device according to an exemplary embodiment of the present inventive concept may include a peripheral logic structure PS and a cell array structure CS, which is stacked on the peripheral logic structure PS. For example, when viewed in a plan view (e.g., along a third direction DF3, which is orthogonal to first and second direction D1 and D2), the peripheral logic structure PS and the cell array structure CS may overlap each other. The first and second directions D1 and D2 may be perpendicular to each other.

In an exemplary embodiment of the present inventive concept, the peripheral logic structure PS may include a page buffer, a control circuit, and row and column decoders that control a cell array of a three-dimensional semiconductor memory device.

The cell array structure CS may include a plurality of memory blocks BLK1 to BLKn each of which may be a data erasure unit. Each of the memory blocks BLK1 to BLKn may include a memory cell array having a three-dimensional structure. Each of the memory blocks BLK1 to BLKn may include a memory cell array having a vertical structure. The memory cell array may include three-dimensionally arranged memory cells and a plurality of word lines and bit lines electrically connected to the memory cells. As an example, the memory cell array having the three-dimensional structure will be discussed below in more detail with reference to the accompanying drawings.

Figure 2:
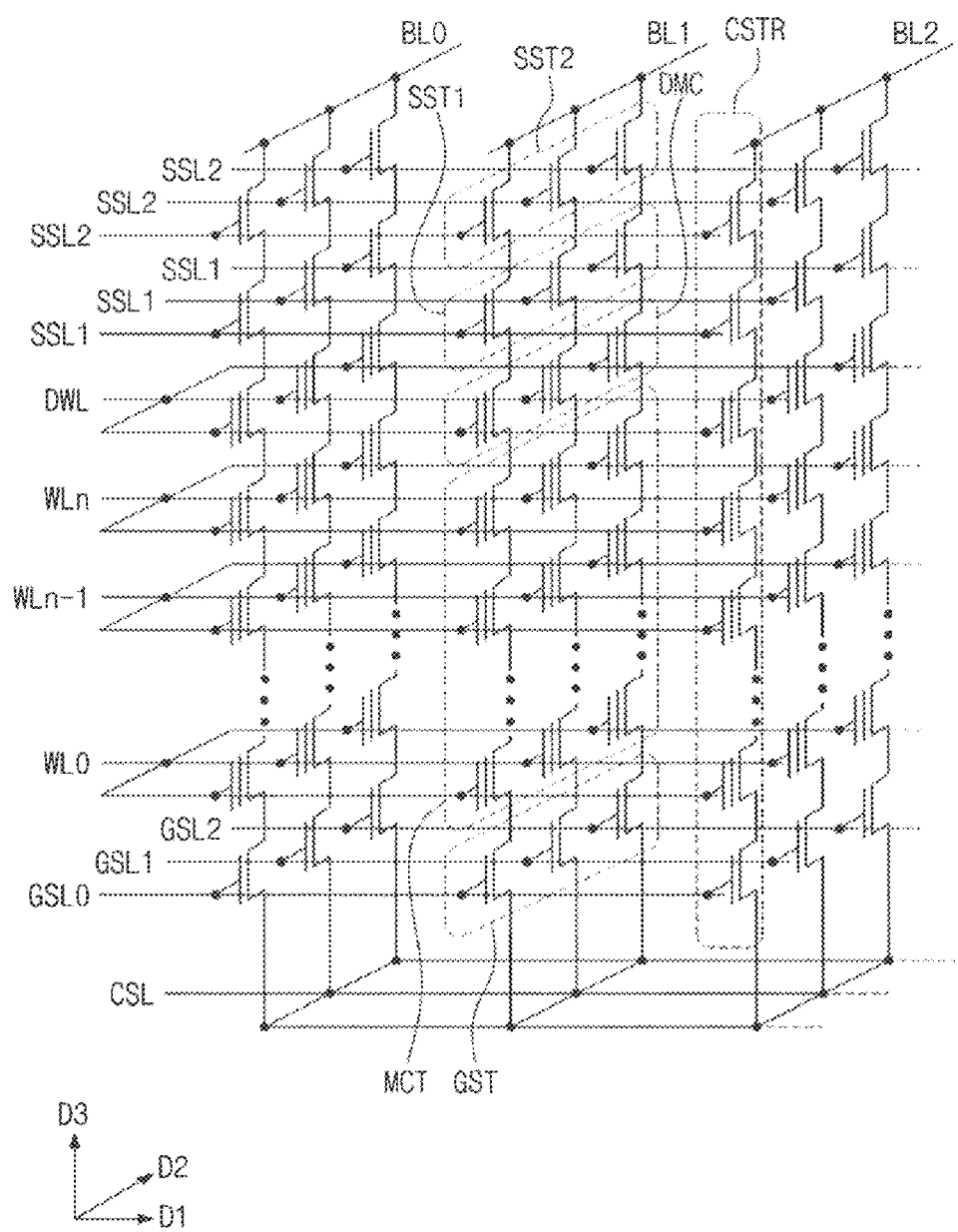
FIG. 2 is a circuit diagram of a cell array of a three-dimensional semiconductor memory device according to an exemplary embodiment of the present inventive concept.

FIG. 2 is a circuit diagram of a cell array of a three-dimensional semiconductor memory device according to an exemplary embodiment of the present inventive concept.

Referring to FIG. 2, a cell array of a three-dimensional semiconductor memory device according to an exemplary embodiment of the present inventive concept may include a common source line CSL, a plurality of bit lines BL0 to BL2, and a plurality of cell strings CSTR between the common source line CSL and the bit lines BL0 to BL2.

The cell strings CSTR may extend along the third direction D3 (e.g., along a plane elongated from first and second directions D1 and D2). The bit lines BL0 to BL2 may be spaced apart from each other in the first direction D1, and may extend in the second direction D2.

A plurality of cell strings CSTR may be connected in parallel to each of the bit lines BL0 to BL2. The plurality of cell strings CSTR may be commonly connected to the common source line CSL. A plurality of cell strings CSTR may be disposed between a plurality of bit lines BL0 to BL2 and one common source line CSL. The common source line CSL may include a plurality of common source lines CSL, and the plurality of common source lines CSL may be two-dimensionally arranged. For example, the common source lines CSL may extend along the first and second direction D1 and D2. Alternatively, the common source lines may extend along only one of the first direction D1 or the second direction D2. The common source lines CSL may be supplied with the same voltage as each other or may be electrically controlled independently of each other. Thus, a different voltage may be applied to each of the common source lines CSL.

In an exemplary embodiment of the present inventive concept, each of the cell strings CSTR may include string select transistors SST1 and SST2 connected in series, memory cells MCT connected in series, and a ground select transistor GST. Each of the memory cells MCT may include a data storage element.

For example, each of the cell strings CSTR may include first and second string select transistors SST1 and SST2 connected in series. The second string select transistor SST2 may be coupled to (e.g., may be electrically connected to) one of the bit lines BL0 to BL2, and the ground select transistor GST may be coupled to (e.g., may be electrically connected to) the common source line CSL. The memory cells MCT may be connected in series between the first string select transistor SST1 and the ground select transistor GST.

Each of the cell strings CSTR may include a dummy cell DMC connected between the first string select transistor SST1 and the memory cell MCT. The dummy cell DMC may also be connected between the ground select transistor GST and the memory cell MCT. Alternatively, similar to the first and second string select transistors SST1 and SST2, the ground select transistor GST may include a plurality of MOS transistors connected in series in each of the cell strings CSTR. Alternatively, each of the cell strings CSTR may include a single string select transistor.

In an exemplary embodiment of the present inventive concept, the first string select transistor SST1 may be controlled by a first string select line SSL1, and the second string select transistor SST2 may be controlled by a second string select line SSL2. The memory cells MCT may be controlled by a plurality of word lines WL0 to WLn, and the dummy cells DMC may be controlled by a dummy word line DWL. The ground select transistor GST may be controlled by a corresponding one of ground select lines GSL0 to GSL2. The common source line CSL may be connected in common to sources of the ground select transistors GST. The ground select lines (e.g., ground select lines GSL0 to GSL2) may each include cell gate electrodes (e.g., cell gate electrodes CGE, which are described in more detail below). The ground select lines may be vertically stacked above the semiconductor substrate. A plurality of word lines may be stacked on the ground select lines to form a stepped structure above the ground select lines. Each of the ground select lines and the word lines may be electrically connected to the peripheral logic structure (e.g., by the through via structure TVS) described herein.

A single cell string CSTR may include a plurality of memory cells MCT that are spaced apart from the common source line CSL at different distances. For example, the plurality of memory cells MCT may be spaced apart from each other along the first direction D1. A plurality of word lines WL0 to WLn and DWL may be disposed between the common source lines CSL and the bit lines BL0 to BL2.

The memory cells MCT may include gate electrodes at substantially the same distance from the common source lines CSL, and the gate electrodes may be connected in common to one of the word lines WL0 to WLn and DWL, thus being in an equipotential state. As an example, though the gate electrodes of the memory cells MCT may be at substantially the same distance from the common source lines CSL, the gate electrodes disposed at different rows or columns may be independently controlled. Thus, different voltages may be applied to each of the gate electrodes.

The ground select lines GSL0 to GSL2 and the string select lines SSL1 and SSL2 may extend along the first direction D1 and may be spaced apart from each other in the second direction D2. The ground select lines GSL0 to GSL2 may be located at substantially the same level from the common source lines CSL, thus being electrically separated from each other. The same may be true of the string select lines SSL1 and SSL2. For example, each of the ground select lines may be positioned at an equal distance as each other above the common source line CSL.

Figure 3A:
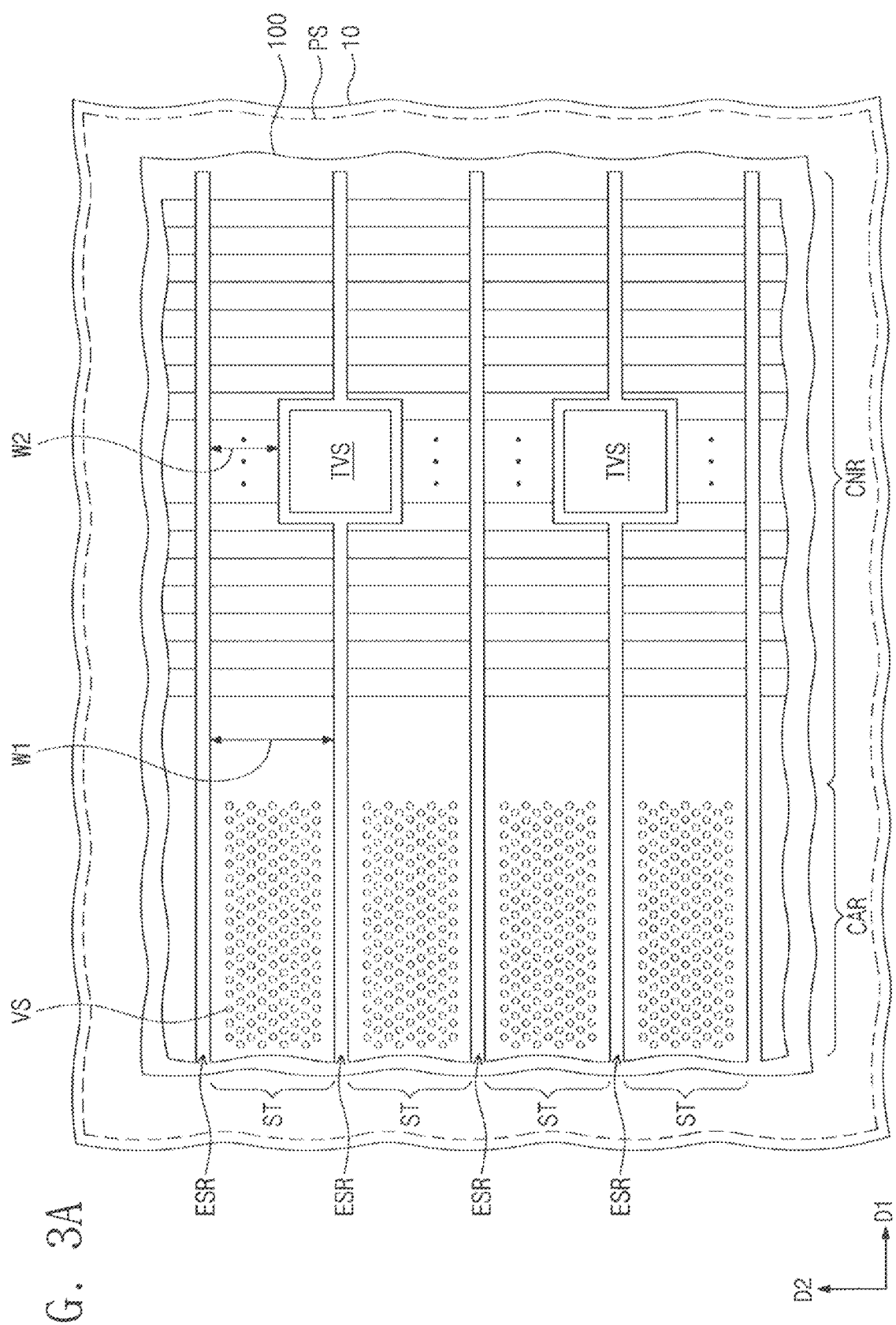
FIGS. 3A and 3B are plan views of a three-dimensional semiconductor memory device according to an exemplary embodiment of the present inventive concept.
Figure 3B:
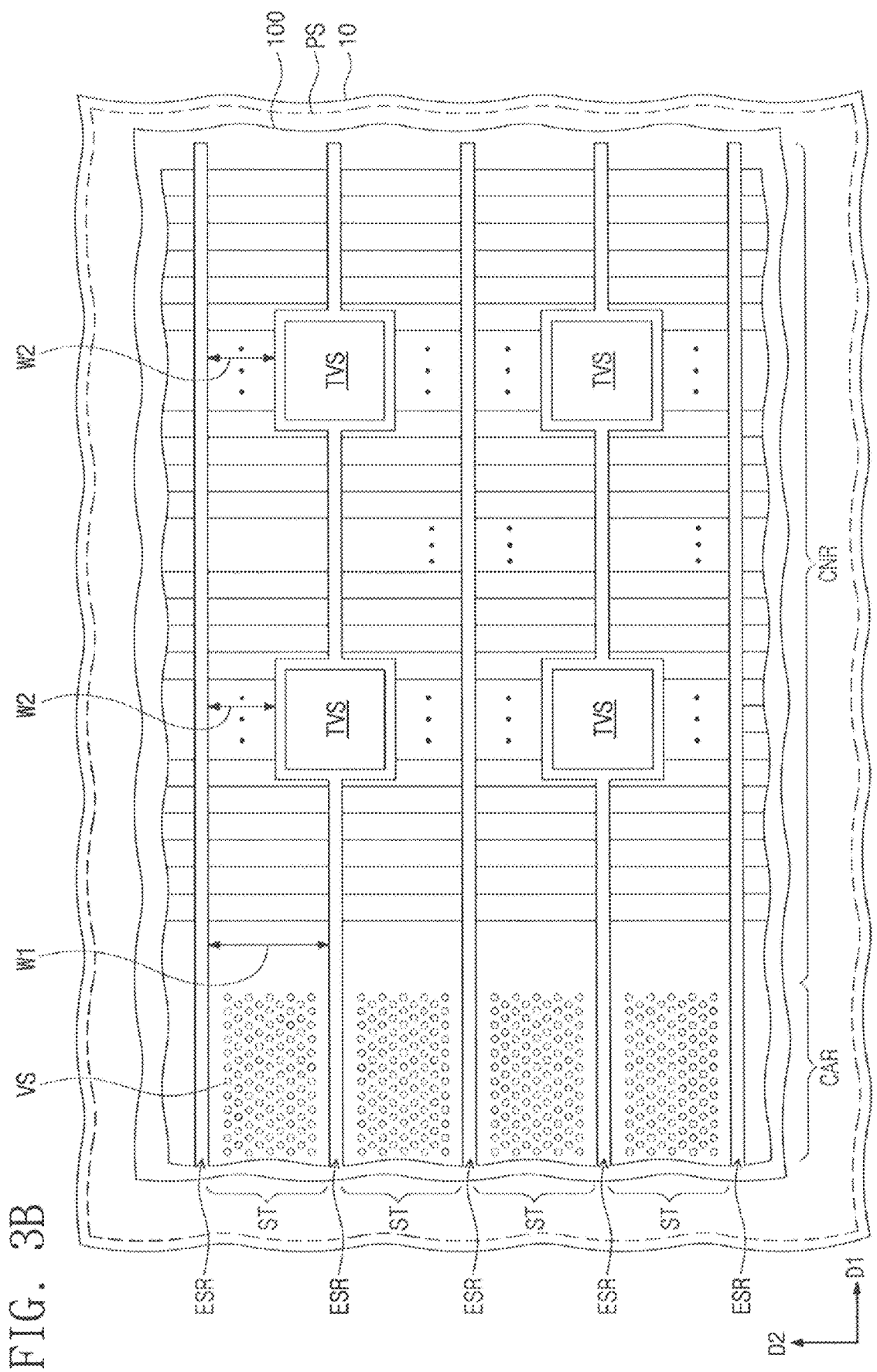

FIGS. 3A and 3B are plan views of a three-dimensional semiconductor memory device according to an exemplary embodiment of the present inventive concept.

Referring to FIGS. 3A and 3B, a three-dimensional semiconductor memory device according to an exemplary embodiment of the present inventive concept may include the peripheral logic structure PS on a semiconductor substrate 10, a cell array structure (e.g., cell array structure CS described above with reference to FIG. 1) on the peripheral logic structure PS, and a through via structure TVS that connects the cell array structure CS and the peripheral logic structure PS to each other.

The peripheral logic structure PS may include peripheral logic circuits that process data communicated with a three-dimensional cell array.

The cell array structure CS may include a plurality of electrode structures ST on a horizontal semiconductor layer 100 and a plurality of vertical structures VS penetrating each of the electrode structures ST. In an exemplary embodiment of the present inventive concept, when viewed in a plan view, the cell array structure CS may overlap the peripheral logic structure PS (see, e.g., FIG. 1). For example, the cell array structure may overlap the peripheral logic structure PS along the third direction D3.

As an example, the horizontal semiconductor layer 100 may include a cell array region CAR on which memory cells are provided and a connection region CNR to which contact plugs and conductive lines coupled to the memory cells are connected. The electrode structures ST may extend in the first direction D1 on the horizontal semiconductor layer 100. Adjacent electrode structures ST may be spaced apart from each other by an electrode separation region ESR that separates the adjacent electrode structures ST from each other in the second direction D2 intersecting the first direction D1. As an example, the second direction D2 may be perpendicular to the first direction D1.

In an exemplary embodiment of the present inventive concept, each of the electrode structures ST may include a first line part having a first width W1 and a second line part having a second width W2 less than the first width W1. Adjacent electrode structures ST may be disposed such that their second line parts may face each other. A pair of adjacent electrode structures ST may be disposed mirror-symmetrically to each other to define at least one contact region (see, e.g., the region defined by a through via structure TVS in FIG. 6) that partially exposes the horizontal semiconductor layer 100. For example, the contact region may be defined between the second line parts of two adjacent electrode structures ST. The electrode structures ST may define more than one contact region. Referring to FIG. 3B, a pair of adjacent electrode structures ST may define a plurality of contact regions spaced apart from each other in the first direction D1.

The through via structure TVS may be provided on the contact region defined by a pair of electrode structures ST. For example, one or more through via structures TVS may be provided between the second line parts of a pair of electrode structures ST.

Figure 4:
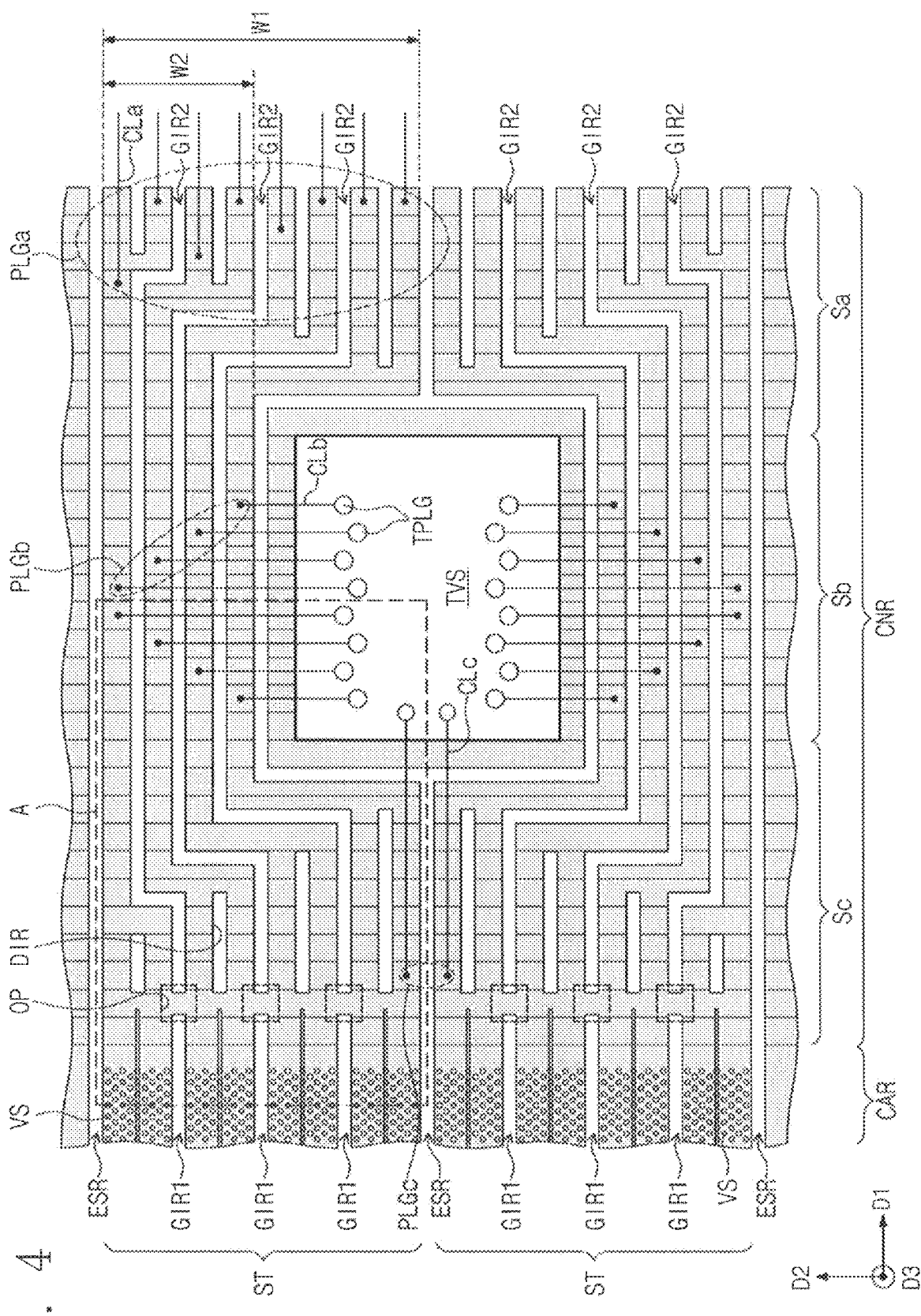
FIG. 4 is a plan view of a cell array structure of a three-dimensional semiconductor memory device according to an exemplary embodiment of the present inventive concept.
Figure 5:
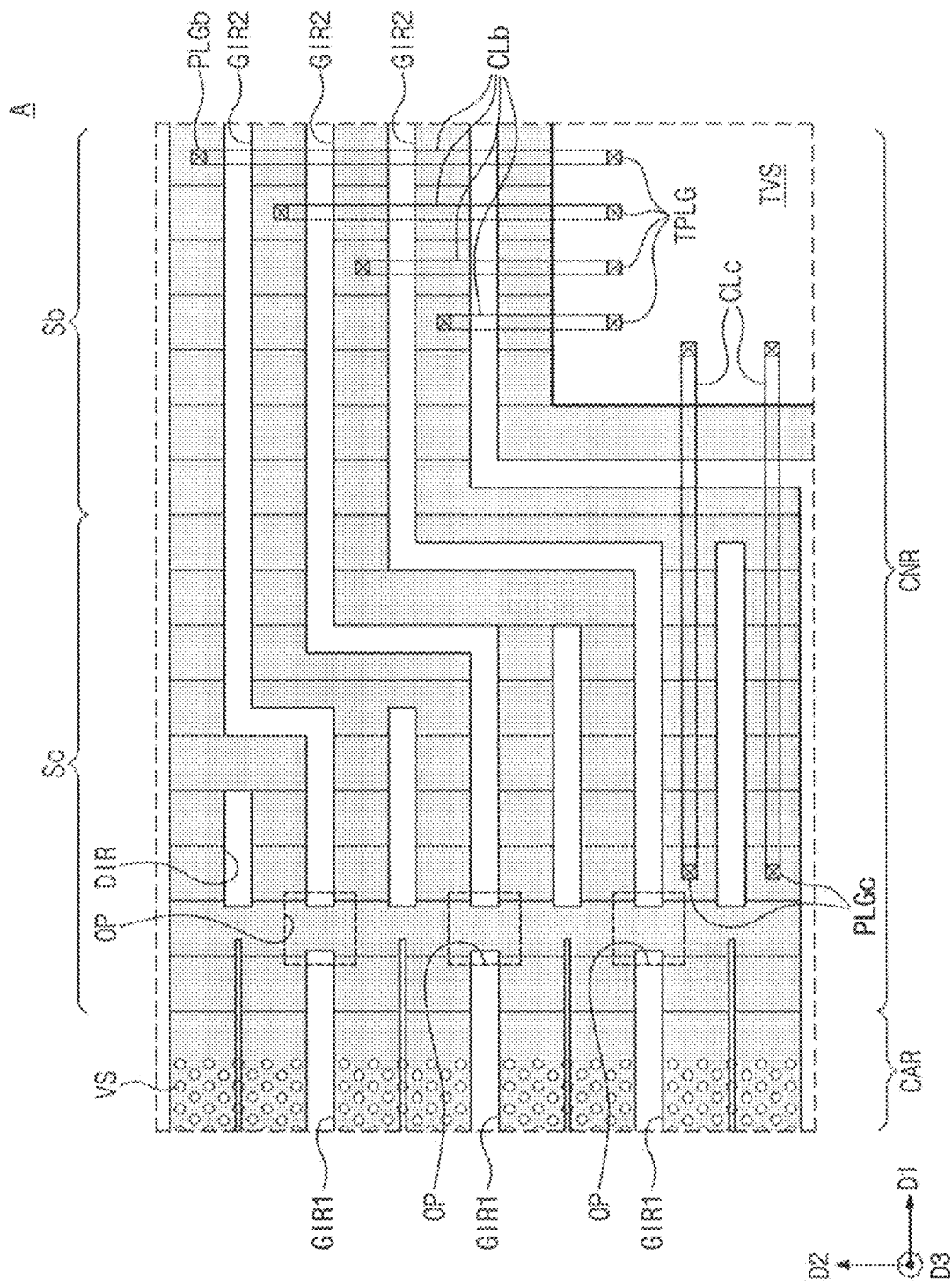
FIG. 5 is an enlarged view of section A of FIG. 4.
Figure 6:
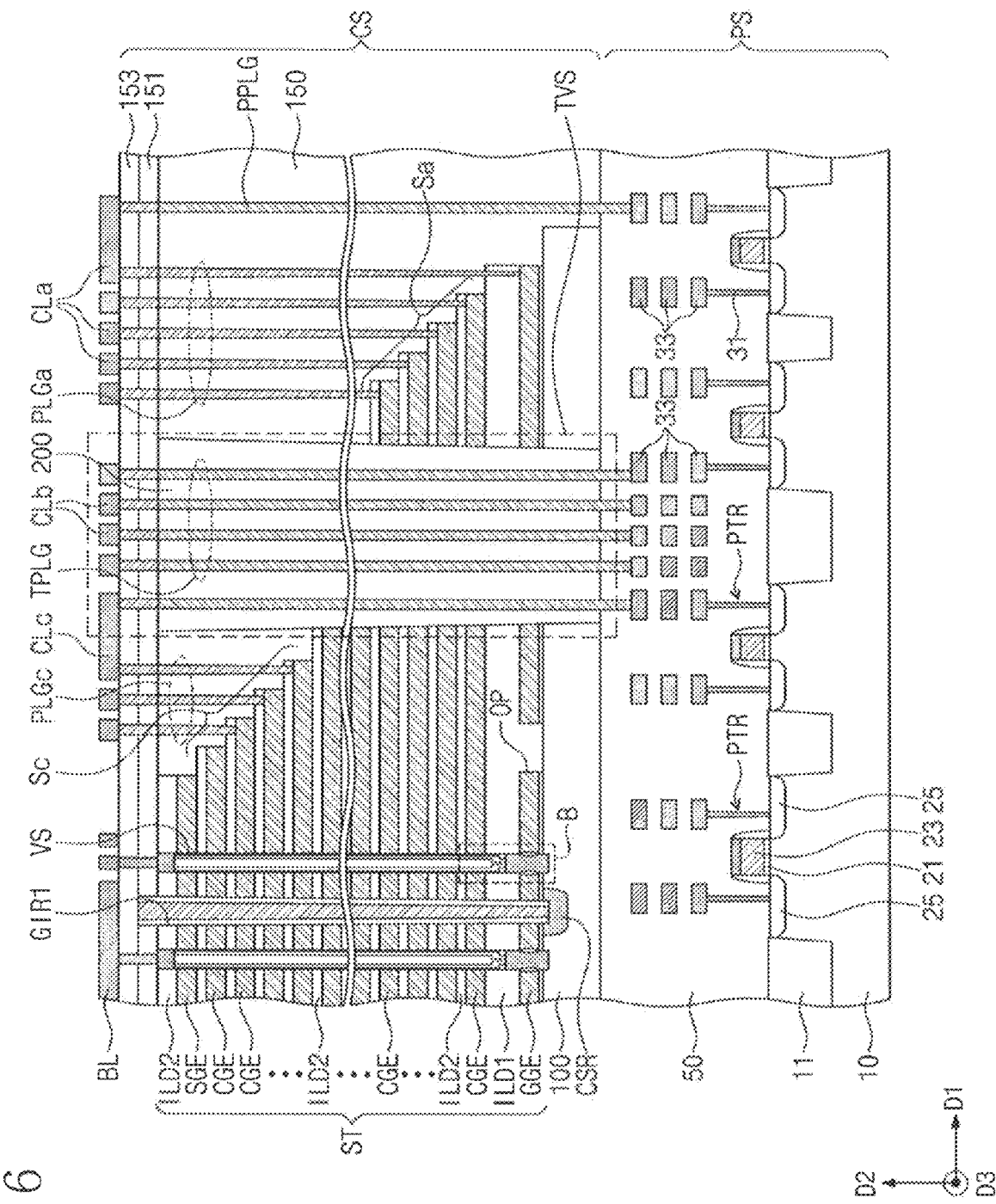
FIG. 6 is a cross-sectional view of a three-dimensional semiconductor memory device according to an exemplary embodiment of the present inventive concept.
Figure 7A:
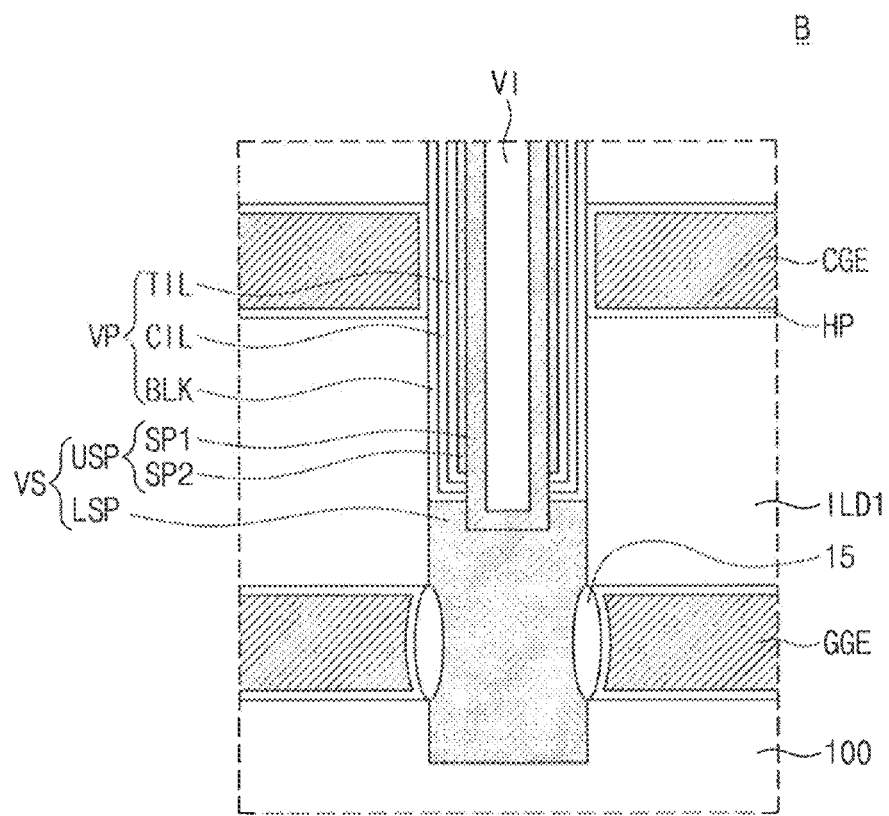
FIGS. 7A and 7B are enlarged views of section B of FIG. 6.
Figure 7B:
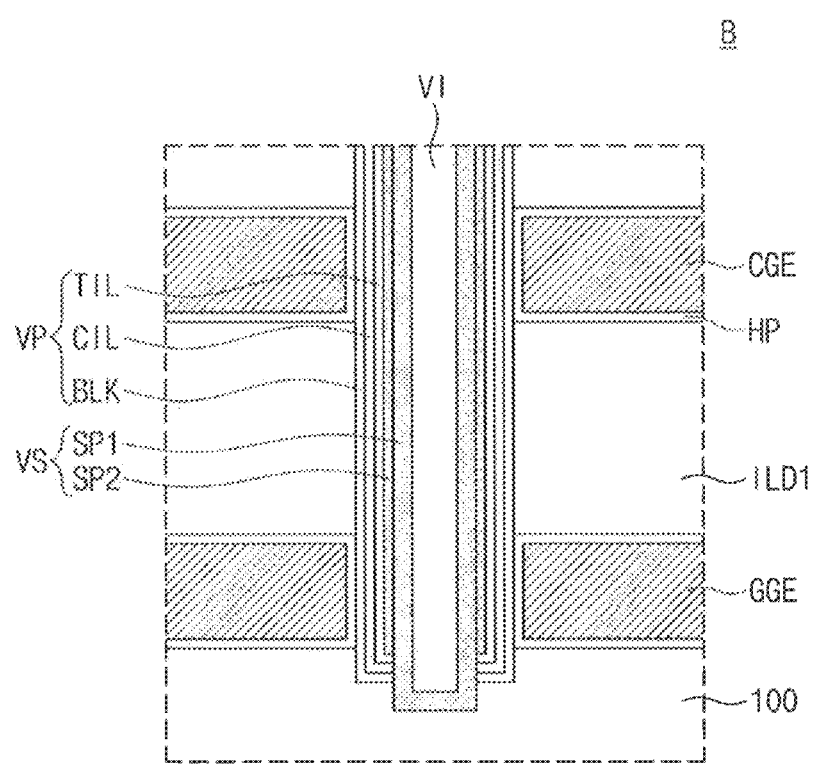

FIG. 4 is a plan view of a cell array structure of a three-dimensional semiconductor memory device according to an exemplary embodiment of the present inventive concept. FIG. 5 is an enlarged view of section A of FIG. 4. FIG. 6 is a cross-sectional view of a three-dimensional semiconductor memory device according to an exemplary embodiment of the present inventive concept. FIGS. 7A and 7B are enlarged views of section B of FIG. 6.

Figure 8:
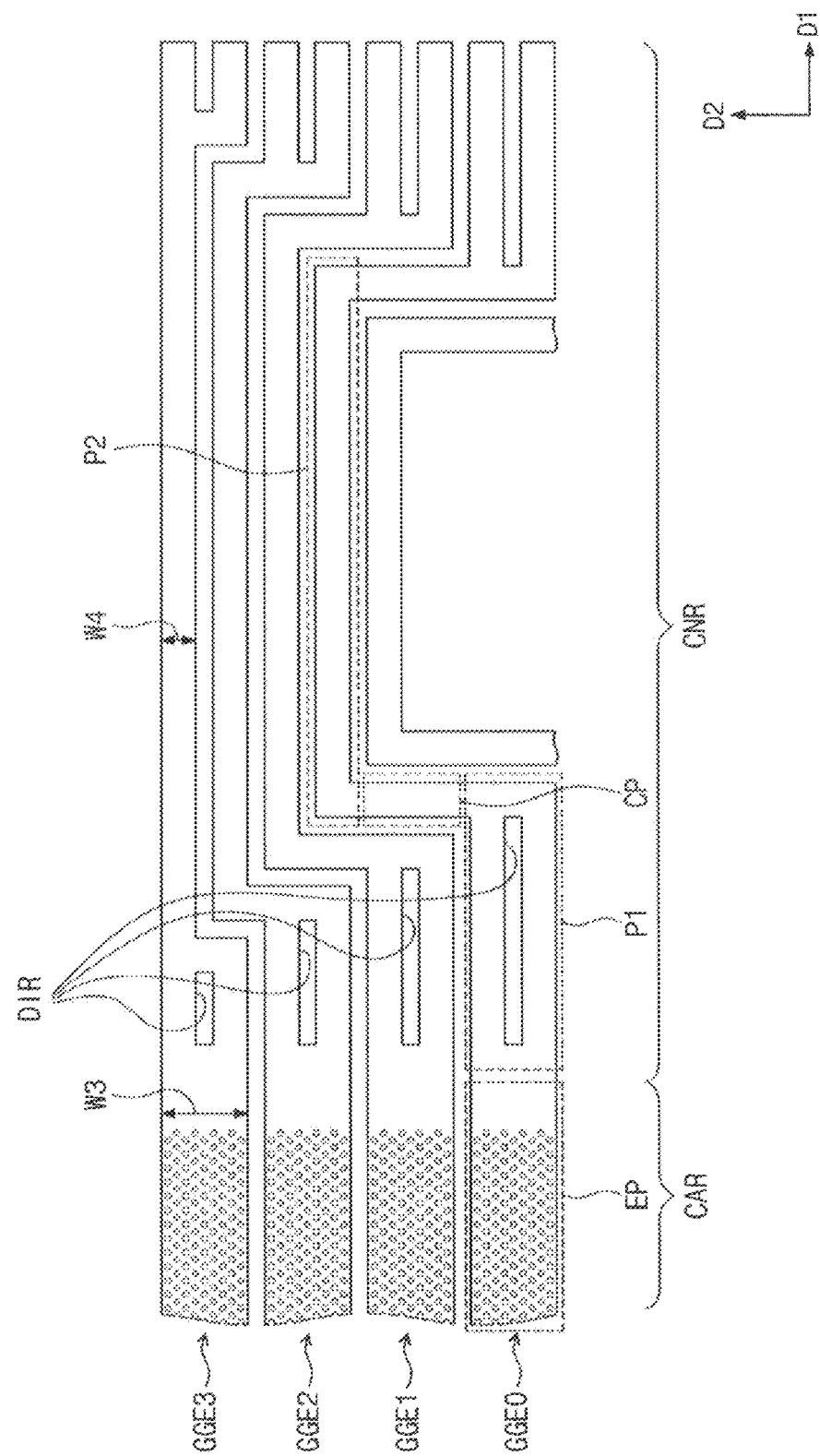
FIG. 8 is a plan view of ground select gate electrodes included in an electrode structure according to an exemplary embodiment of the present inventive concept.
Figure 9:
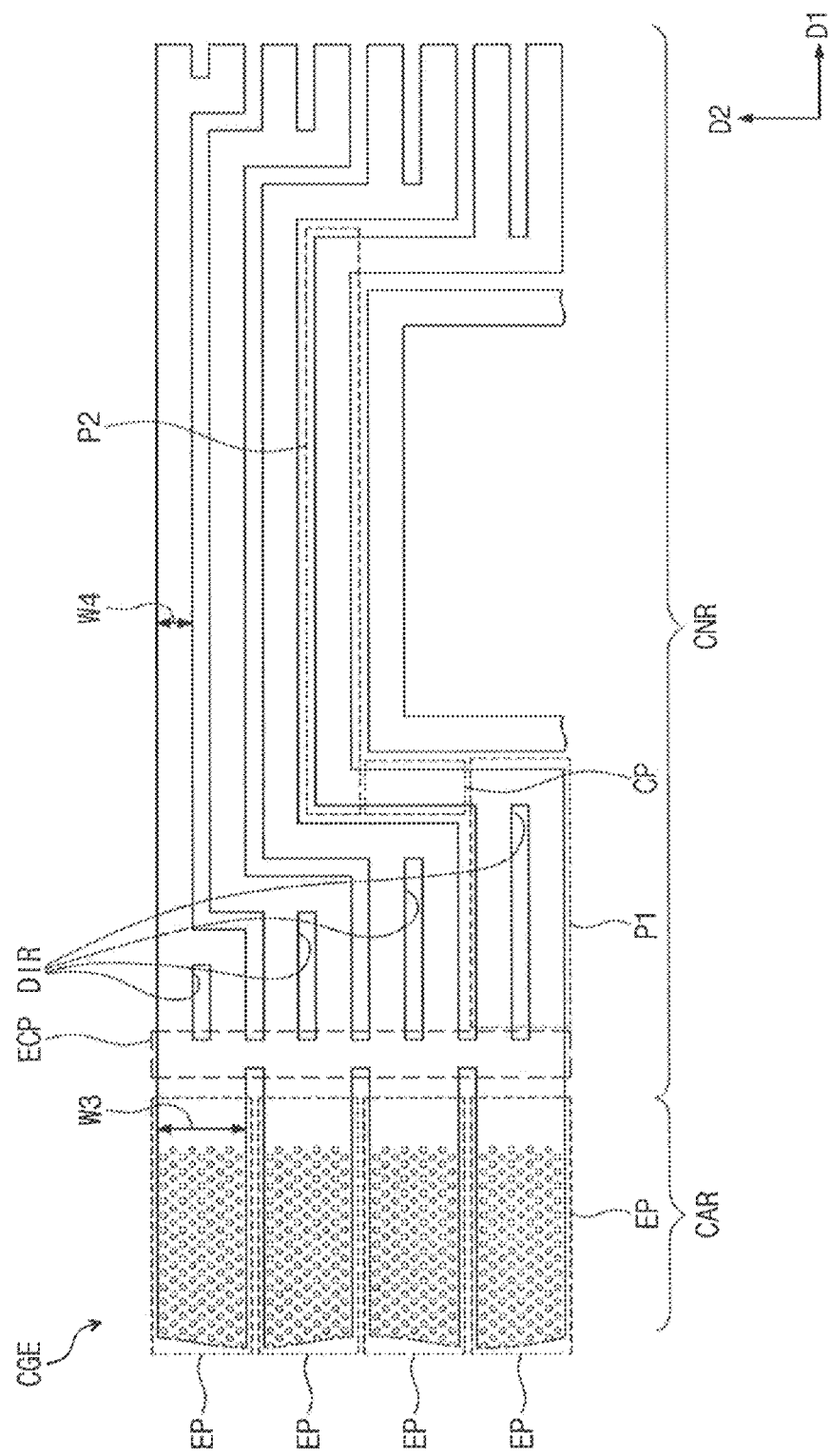
FIG. 9 is a plan view of a cell gate electrode included in an electrode structure according to an exemplary embodiment of the present inventive concept.

FIG. 8 is a plan view of ground select gate electrodes included in an electrode structure according to an exemplary embodiment of the present inventive concept. FIG. 9 is a plan view of a cell gate electrode included in an electrode structure according to an exemplary embodiment of the present inventive concept.

Referring to FIGS. 4, 5, and 6, the peripheral logic structure PS may include peripheral logic circuits PTR disposed on the semiconductor substrate 10 and a lower buried insulating layer 50 covering the peripheral logic circuits PTR. A plurality of peripheral logic circuits PTR may be disposed on the semiconductor substrate, and may be spaced apart from each other along the first direction D1. The peripheral logic circuits PTR may be in direct contact with an upper surface of the semiconductor substrate. For example, the peripheral logic circuits PTR may each be disposed on a source or drain region (e.g., source/drain regions 25) formed in the semiconductor substrate 10. The semiconductor substrate 10 may be or include a silicon substrate, a silicon-germanium substrate, a germanium substrate, or a single crystalline epitaxial layer grown on a single crystalline silicon substrate. The peripheral logic circuits PTR may be, as discussed above, row and column decoders, a page buffer, or a control circuit, and may include NMOS or PMOS transistors, low-voltage or high-voltage transistors, and a resistor that are integrated on the semiconductor substrate 10.

For example, the semiconductor substrate 10 may be provided therein with a device isolation layer 11 that defines active regions. The active regions of the semiconductor substrate 10 may be provided thereon with peripheral gate electrodes 23 and gate dielectric layers 21 disposed between the peripheral gate electrodes 23 and the semiconductor substrate 10. Source/drain regions 25 may be provided in the semiconductor substrate 10 on opposite sides of each of the peripheral gate electrodes 23. Peripheral circuit lines 33 may be electrically connected through peripheral circuit contact plugs 31 to the peripheral logic circuits PTR. For example, the peripheral circuit contact plugs 31 and the peripheral circuit lines 33 may be coupled to the NMOS and PMOS transistors.

On the semiconductor substrate 10, the lower buried insulating layer 50 may cover the peripheral logic circuits PTR (e.g., may be disposed on side surfaces of the peripheral logic circuits PTR), the peripheral circuit contact plugs 31, and the peripheral circuit lines 33. The lower buried insulating layer 50 may include a plurality of stacked insulating layers. For example, the lower buried insulating layer 50 may include a silicon oxide layer, a silicon nitride layer, a silicon oxynitride layer, or a low-k dielectric layer.

The cell array structure CS may be disposed on the lower buried insulating layer 50, and may include the horizontal semiconductor layer 100, the electrode structures ST, and the vertical structures VS.

The horizontal semiconductor layer 100 may include a semiconductor material including, for example, silicon (Si), germanium (Ge), silicon germanium (SiGe), gallium arsenic (GaAs), indium gallium arsenic (InGaAs), aluminum gallium arsenic (AlGaAs), or a mixture thereof. Additionally or alternatively, the horizontal semiconductor layer 100 may include either semiconductor doped with a first conductivity impurity or intrinsic semiconductor doped with no impurity. Additionally or alternatively, the horizontal semiconductor layer 100 may have a crystal structure including one or more of a single crystalline structure, an amorphous structure, or a polycrystalline structure.

The horizontal semiconductor layer 100 may include the cell array region CAR and the connection region CNR around the cell array region CAR. In an exemplary embodiment of the present inventive concept, the cell strings CSTR (see, e.g., FIG. 2) may be integrated on the cell array region CAR of the horizontal semiconductor layer 100.

A plurality of electrode structures ST may be disposed on the horizontal semiconductor layer 100. The electrode structures ST may extend along the first direction D1 from the cell array region CAR toward the connection region CNR. The electrode structures ST may be spaced apart from each other in the second direction D2.

Each of the electrode structures ST may include electrodes GGE, CGE, and SGE and insulating layers ILD1 and ILD2 that are alternately stacked along the third direction D3 (e.g., a vertical direction with respect to an upper surface of the horizontal semiconductor layer 100) perpendicular to the first and second directions D1 and D2. For example, each of the electrode structures ST may include a plurality of cell gate electrodes CGE that are vertically stacked, a plurality of ground select gate electrodes GGE that are horizontally spaced apart from each other beneath a lowermost cell gate electrode CGE, and a plurality of string select gate electrodes SGE that are horizontally spaced apart from each other above an uppermost cell gate electrode CGE. Each of the electrode structures ST may have a structure where the plurality of ground select gate electrodes GGE are located at the same level from a top surface of the horizontal semiconductor layer 100 as each other and the plurality of cell gate electrodes CGE are located at different levels from the top surface of the horizontal semiconductor layer 100 from each other. The ground select gate electrodes GGE may each include ground select lines (e.g., ground select lines GSL described in more detail above). The cell gate electrodes CGE may each include word lines (e.g., word lines WL described in more detail above).

In each of the electrode structures ST, lowermost ground select gate electrodes GGE may serve as gate electrodes of the ground select transistors (e.g., GST of FIG. 2) that control electrical connections between the common source line (e.g., CSL of FIG. 2) and the vertical structures VS. Uppermost string select gate electrodes SGE may serve as gate electrodes of the string select transistors (e.g., SST of FIG. 2) that control electrical connections between the vertical structures VS and a bit line BL. The bit line BL may be positioned above the string select electrodes SGE. The cell gate electrodes CGE may serve as the control gate electrodes (e.g., WL0 to WL3 and DWL of FIG. 2) of the memory cells (e.g., MCT of FIG. 2).

On the cell array region CAR, a plurality of vertical structures VS may penetrate the electrode structure ST to come into contact (e.g., to be electrically connected with) with the horizontal semiconductor layer 100. When viewed in a plan view, the vertical structures VS may be arranged, for example, in a straight line (e.g., a matrix shape) or a zigzag pattern. The vertical structures VS may include a semiconductor material such as silicon (Si), germanium (Ge), or a mixture thereof. Additionally or alternatively, the vertical structures VS may include impurity-doped semiconductor or undoped intrinsic semiconductor. The vertical structures VS including a semiconductor material may serve as channels of the select transistors SST and GST, the memory cells MCT, and the dummy cell DMC described above with reference to FIG. 2.

Referring to FIG. 7A, each of the vertical structures VS may include a lower semiconductor pattern LSP and an upper semiconductor pattern USP. The lower semiconductor pattern LSP may include an epitaxial layer that is epitaxially grown from the horizontal semiconductor layer 100. The lower semiconductor pattern LSP may have a pillar shape that fills a lower portion of a vertical hole. The lower semiconductor pattern LSP may have a top surface higher than that of the lowermost ground select gate electrode GGE. The upper semiconductor pattern USP may be connected to the lower semiconductor pattern LSP, and may include silicon (Si), germanium (GE), or a mixture thereof. The upper semiconductor pattern USP may be provided on its top end with a bit line conductive pad, which may be an impurity-doped region or may include a conductive material. The upper semiconductor pattern USP may include a first semiconductor pattern SP1 and a second semiconductor pattern SP2. The first semiconductor pattern SP may be coupled to the lower semiconductor pattern LSP, and may have a cylindrical or pipe shape with a closed bottom end. The first semiconductor pattern SP1 may have an inside substantially filled with a buried insulating pattern VI. The first semiconductor pattern SP1 may electrically connect the second semiconductor pattern SP2 and the lower semiconductor pattern LSP to each other. The second semiconductor pattern SP2 may have a cylindrical or pipe shape with open top and bottom ends. The second semiconductor pattern SP2 need not be in contact with, but may be spaced apart from, the lower semiconductor pattern LSP.

Referring to FIG. 7B, each of the vertical structures VS may include a first semiconductor pattern SP1 and a second semiconductor pattern SP2. The first semiconductor pattern SP1 may be in direct contact with the horizontal semiconductor layer 100, and may have an inside substantially filled with a buried insulating pattern VI.

Referring to FIGS. 7A and 7B, a vertical insulating pattern VP may be disposed between the electrode structure ST and the vertical structure VS. The vertical insulating pattern VP may have a cylindrical or pipe shape with open top and bottom ends. The vertical insulating pattern VP may extend in the third direction D3. The vertical insulating pattern VP may be disposed on a sidewall and at least part of a bottom surface of the vertical structure VS. The vertical insulating pattern VP may at least partially surround the vertical structure VS. When the vertical structure VS includes the lower and upper semiconductor patterns LSP and USP, the vertical insulating pattern VP may surround a sidewall of the upper semiconductor pattern USP. In an exemplary embodiment of the present inventive concept, the vertical insulating pattern VP may be a portion of a data storage layer. For example, the vertical insulating pattern VP may include a tunnel insulating layer TIL, a charge storage layer CIL, and a blocking insulating layer BLK, which include a data storage layer of a NAND Flash memory device. For example, the charge storage layer CIL may be a trap insulating layer, a floating gate electrode, or an insulating layer including conductive nano-dots. Alternatively, the vertical insulating pattern VP may include a thin film for a phase change memory device or variable resistance memory device.

A horizontal insulating pattern HP may be disposed between the vertical insulating pattern VP and sidewalls of the electrodes GGE, CGE, and SGE, and may extend onto top and bottom surfaces of each of the electrodes GGE, CGE, and SGE. The horizontal insulating pattern HP may include a charge storage layer serving as a portion of a data storage layer of an NAND Flash memory device.

Referring back to FIGS. 4, 5, and 6, in each of the electrode structures ST, the electrodes GGE, CGE, and SGE may be stacked. The electrodes GGE, CGE, and SGE (e.g., the electrodes CGE) may have a stepwise structure. Therefore, each of the electrode structures ST may have a height that decreases with increasing distance from the cell array region CAR. The electrodes GGE, CGE, and SGE of each of the electrode structures ST may have lengths in the first direction D1 that decrease with increasing distance from the horizontal semiconductor layer 100 (e.g., along the third direction D3).

In an exemplary embodiment of the present inventive concept, each of the electrode structures ST may include a lower stepwise structure Sa, an intermediate stepwise structure Sb, and an upper stepwise structure Sc that are sequentially provided along the first direction D1 (see, e.g., FIGS. 4 and 6). For example, the electrode structure ST may include a lower region, an intermediate region, and an upper region that are sequentially provided along the third direction D3 perpendicular to the top surface of the horizontal semiconductor layer 100. The lower stepwise structure Sa may include the electrodes GGE and CGE provided on the lower region of the electrode structure ST, and the intermediate stepwise structure Sb may include the electrodes CGE provided on the intermediate region of the electrode structure ST. The upper stepwise structure Sc may include the electrodes CGE and SGE provided on the upper region of the electrode structure ST.

Each of the electrode structures ST may include the first line part having the first width W1 and the second line part having the second width W2 (see, e.g., FIGS. 3A and 3B). The through via structure TVS may be provided between the second line parts of a pair of adjacent electrode structures ST.

The through via structure TVS may include a through insulation pattern 200 that at least partially penetrates the horizontal semiconductor layer 100 and extends in the third direction D3 to run across portions of sidewalls of the electrode structures ST, a plurality of through plugs TPLG provided in the through insulation pattern 200, and a plurality of conductive lines CLb coupled to the through plugs TPLG.

The through insulation pattern 200 may extend in the third direction D3 on the lower buried insulating layer 50. The through insulation pattern 200 may include an insulating material such as a silicon oxide layer or a low-k dielectric layer. When viewed in a plan view, the through insulation pattern 200 may be adjacent to a pair of electrode structures ST. As an example, sides of the through insulation pattern 200 may be surrounded by electrode structures ST when viewed in a plan view.

In an exemplary embodiment of the present inventive concept, the through insulation pattern 200 may be positioned between the lower and upper stepwise structures Sa and Sc, which may be arranged in the first direction D1, of each of the electrode structures ST. The through insulation pattern 200 may be between the intermediate stepwise structures Sb, which may be arranged in the second direction D2, of a pair of electrode structures ST. For example, the upper and lower stepwise structures Sc and Sa of each of the electrode structures ST may be adjacent in the first direction D1 to the through insulation pattern 200, and the intermediate stepwise structure Sb of each of the electrode structures ST may be adjacent in the second direction D2 to the through insulation pattern 200.

The through insulation pattern 200 may have a bottom surface in direct contact with the lower buried insulating layer 50 of the peripheral logic structure PS and may have a top surface at substantially the same level (e.g., along the third direction D3) as that of top surfaces of the vertical structures VS. The through insulation pattern 200 may have a greater height in the third direction D3 than those of the electrode structures ST. The through insulation pattern 200 may have a width (e.g., in the first and/or second direction D2 or D3) that varies depending on the height of the electrode structure ST. For example, the width of the through insulation pattern 200 may be substantially the same as the first width W1 of the electrode structure ST.

The through plugs TPLG may penetrate the through insulation pattern 200 and may come into contact with (e.g., may be electrically connected) the peripheral circuit lines 33 of the peripheral logic structure PS. The through plugs TPLG may be connected through the conductive lines CLb to the electrodes CGE that are included in the intermediate stepwise structure Sb of the electrode structure ST.

An upper buried insulating layer 150 may be disposed on side surfaces of the through insulation pattern 200 and stepwise-structured ends of the electrode structures ST. First and second interlayer dielectric layers 151 and 153 may be sequentially stacked on the upper buried insulating layer 150. A bit line BL may be formed on the second interlayer dielectric layer 153. The bit line BL may overlap at least one vertical structure VS (e.g., along the third direction D3 orthogonal to the first and second directions D1 and D2).

Lower contact plugs PLGa may penetrate the upper buried insulating layer 150 and may come into direct contact with the electrodes GGE and CGE that are provided on the lower region of the electrode structure ST to form the lower stepwise structure Sa. The lower contact plugs PLGa may be connected to (e.g., may be electrically connected to) connection contact plugs PPLG through first conductive lines CLa extending in the first direction D1. The connection contact plugs PPLG may penetrate the upper buried insulating layer 150 to come into connection with the peripheral circuit lines 33 of the peripheral logic structure PS.

Intermediate contact plugs PLGb (see. e.g., FIGS. 4 and 6) may penetrate the upper buried insulating layer 150 and may come into direct contact with the electrodes CGE that are provided on the intermediate region of the electrode structure ST to form the intermediate stepwise structure Sb. The intermediate contact plugs PLGb may be connected to (e.g., may be electrically connected to) the through plugs TPLG through second conductive lines CLb extending in the second direction D2.

Upper contact plugs PLGc may penetrate the upper buried insulating layer 150 and may come into direct contact with the electrodes CGE and SGE that are provided on the upper region of the electrode structure ST to form the upper stepwise structure Sc. The upper contact plugs PLGc may be connected to (e.g., may be electrically connected to) the through plugs TPLG through third conductive lines CLc extending in the first direction D1.

In an exemplary embodiment of the present inventive concept, the cell array region CAR may be provided with first gate insulation regions GIR1 penetrating each of the electrode structures ST, and the connection region CNR may be provided with second gate insulation regions GIR2 penetrating each of the electrode structures ST. The first gate insulation regions GIR1 may extend substantially parallel to each other in the first direction D1. The second gate insulation regions GIR2 may extend substantially parallel to each other (e.g., in the first direction D1). The second gate insulation regions GIR2 may include portions that extend in the second direction D2. The second gate insulation regions GIR2 may surround the through insulation pattern 200 (e.g., when viewed in a plan view). For example, portions of the second gate insulation regions GIR2 may be provided on the second line part having the second width W2 of the electrode structure ST. The second gate insulation regions GIR2 may be configured such that the portions provided on the second line part may have different lengths from each other in the first direction D1. The first gate insulation regions GIR1 may be spaced apart in the first direction D from the second gate insulation regions GIR2. For example, though each of the electrode structures ST may have three first gate insulation regions GIR1 and three second gate insulation regions GIR2, exemplary embodiments of the present inventive concept are not limited thereto. The number of each of the first and second gate insulation regions GIR1 and GIR2 may be changed, for example, on the basis of integration and/or process conditions of a three-dimensional semiconductor memory device.

The connection region CNR may be provided with dummy gate insulation regions DIR penetrating the electrode structures ST. The dummy gate insulation regions DIR may have linear shapes extending in the first direction D1, and may be spaced apart from the second gate insulation regions GIR2. On the connection region CNR, the dummy gate insulation regions DIR may be provided on the first line part having the first width W1 of the electrode structure ST.

Adjacent electrode structures ST may be provided therebetween with the electrode separation regions ESR, one of which linearly extends from the cell array region CAR toward the connection region CNR. Another one of the electrode separation regions ESR may extend from the cell array region CAR toward the connection region CNR while including portions extending in the second direction D2 to surround the through insulation pattern 200.

Each of the electrode structures ST may be provided with gate openings OP between the lowermost ground select gate electrodes GGE in the second direction D2 and between the first gate insulation regions GIR1 and the second gale insulation regions GIR2 in the first direction D1.

Each of the electrode structures ST may be provided with the gate openings OP provided at the lowermost bottom thereof and with the first and second gate insulation regions GIR1 and GIR2, and thus the lowermost ground select gate electrodes GGE of each of the electrode structures ST may be spaced from each other in the second direction D2 and may be electrically separated from each other. The cell gate electrodes CGE vertically stacked on the ground select gate electrodes GGE may have portions overlapping the gate openings OP, which will be described in more detail below with reference to FIGS. 8 and 9.

Common source regions CSR (see, e.g., FIG. 6) may be provided in the horizontal semiconductor layer 100 beneath the first gate insulation regions GIR1 penetrating the electrode structures ST. The common source regions CSR may extend in the first direction D1 parallel to the first gate insulation regions GIR1. The common source regions CSR may include impurities (e.g., N-type impurities such as arsenic (As) or phosphorous (P)) with a conductivity opposite to that of the horizontal semiconductor layer 100.

Referring to FIG. 8, when each of the electrode structures ST is provided with three first gate insulation regions GIR1 and three second gate insulation regions GIR2, the electrode structure ST may include four ground select gate electrodes GGE0, GGE1, GGE2, and GGE3. Each of the ground select gate electrodes GGE0 to GGE3 may include an electrode portion EP disposed on the cell array region CAR and a pad portion (e.g., first pad portion P1) disposed on the connection region CNR. The electrode portion EP of each of the ground select gate electrodes GGE0 to GGE3 may extend in the first direction D1 while having a third width W3. The pad portion of each of the ground select gate electrodes GGE0 to GGE3 may include the first pad portion P1 extending in the first direction D1 from the electrode portion EP while having the third width W3, a second pad portion P2 extending in the first direction D1 while having a fourth width W4 less than the third width W3, and a connection portion CP connecting the first and second pad portions P1 and P2 while extending in the second direction D2. The second pad portions P2 of the ground select gate electrodes GGE0 to GGE3 may have different lengths from each other in the first direction D1. The ground select gate electrodes GGE0 to GGE3 may be configured such that the lengths in the first direction D1 of the second pad portions P2 may gradually increase or decrease. The dummy gate insulation regions DIR may be provided on the first pad portions P1 of the ground select gate electrodes GGE0 to GGE3.

Referring to FIG. 9, in each of the electrode structures ST, each of the cell gate electrodes CGE may include electrode portions EP disposed on the cell array region CAR, pad portions (e.g., pad portion P1) disposed on the connection region CNR, and an electrode connection portion ECP through which the electrode portions EP and the pad portions are connected to each other. As an example, the electrode portions EP and the pad portions may be a single continuous body (e.g., including portions extending in the first and second directions D1 and D2). When each of the electrode structures ST is provided with three first gate insulating regions GIR1 and three second gate insulating regions GIR2, each of the cell gate electrodes CGE may include four electrode portions EP and four pad portions.

The electrode portions EP of the cell gate electrode CGE may extend in the first direction D1 while having a substantially uniform third width W3 on the cell array region CAR. Each of the pad portions of the cell gate electrode CGE may extend in the first direction D1 and have a portion extending in the second direction D2. For example, each of the pad portions of the cell gate electrode CGE may include the first pad portion P1 extending in the first direction D1 from the electrode portion EP while having the third width W3, the second pad portion P2 extending in the first direction D1 while having the fourth width W4 less than the third width W3, and the connection portion CP connecting the first and second pad portions P1 and P2 while extending in the second direction D2. The second pad portions P2 may have different lengths from each other in the first direction D1. The dummy gate insulation regions DIR may be provided on the first pad portions P1 of the cell gate electrode CGE.

According to an exemplary embodiment of the present inventive concept, a semiconductor memory device may include the semiconductor substrate 10 including the cell array region CAR and the connection region CNR (see, e.g., FIG. 3A). The peripheral logic structure PS may be disposed on the semiconductor substrate 10. A plurality of ground select lines (e.g., ground select lines GGE in FIG. 6) may be stacked in the cell array region CAR. The ground select lines may be spaced apart from each other by first insulating layers ILD1. A plurality of word lines (e.g., word lines including cell gate electrodes CGE in FIG. 6) may be stacked on the ground select lines in the cell array region CAR. The word lines may be spaced apart from each other by second insulating layers ILD2. The plurality of word lines may form a stepped structure. The vertical structure VS may penetrate the plurality of word lines and the plurality of ground select lines. The vertical structure VS may be connected to a lowermost ground select line of the plurality of ground select lines. The through via structure TVS may be in the connection region CNR. The through via structure TVS may connect the plurality of ground select lines and the plurality of word lines to the peripheral logic structure PS.

Figure 10:
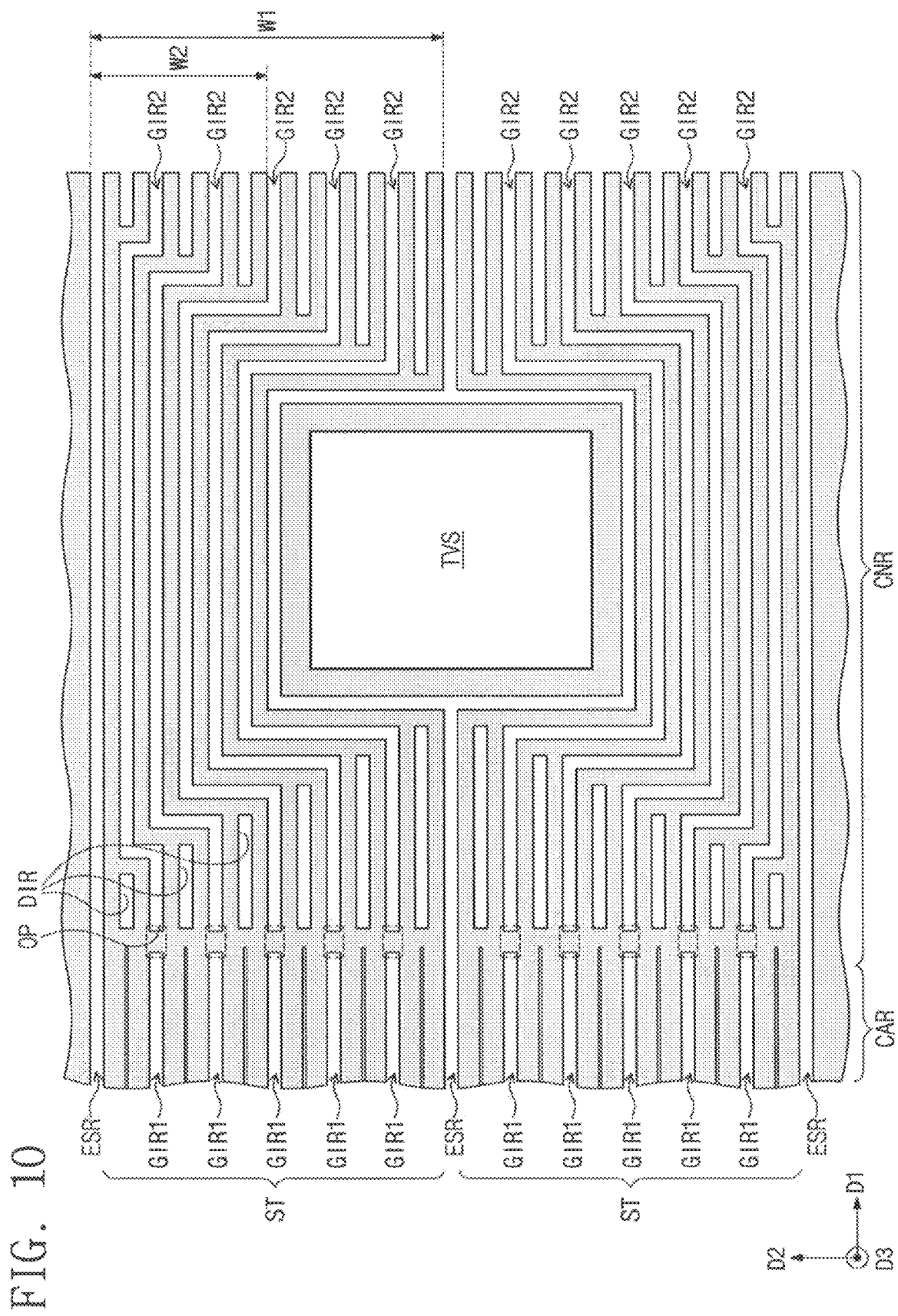
FIGS. 10 and 11 are plan views of a three-dimensional semiconductor memory device according to an exemplary embodiment of the present inventive concept.
Figure 11:
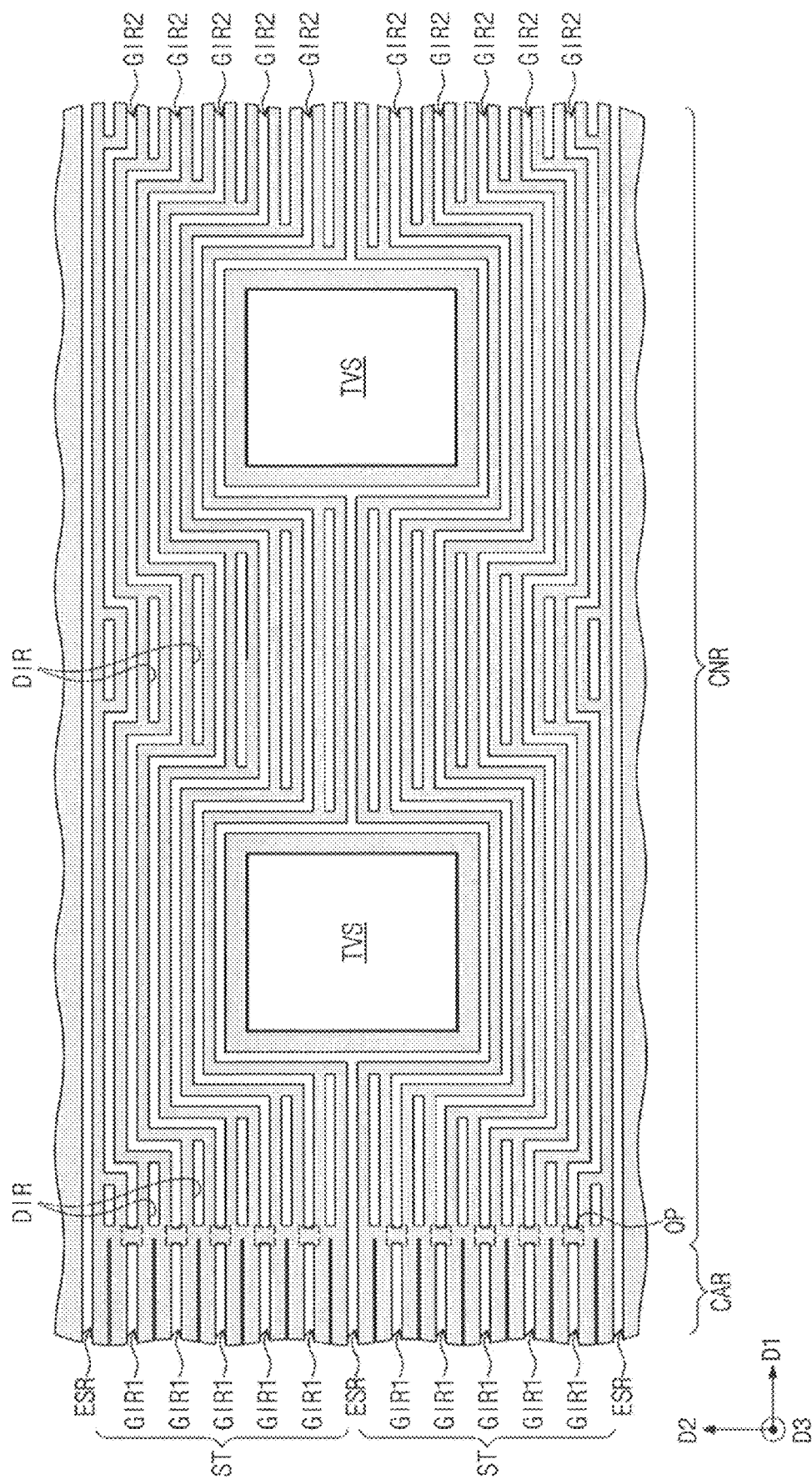

FIGS. 10 and 11 are plan views of a three-dimensional semiconductor memory device according to an exemplary embodiment of the present inventive concept.

Referring to FIGS. 10 and 11, the electrode separation regions ESR may separate the electrode structures ST from each other in the second direction D2. In an exemplary embodiment of the present inventive concept, the cell array region CAR may be provided with five first gate insulation regions GIR1, and the connection region CNR may be provided with five second gate insulation regions GIR2. The second gate insulation regions GIR2 may extend in the first direction D1. The first and second gate insulation regions GIR1 and GIR2 may each include portions extending in the first direction D1 and portions extending in the second direction D2. The first and/or second gate insulation regions GIR1 and GIR2 may at least partially surround the through via structure TVS provided on the connection region CNR (e.g., when viewed in a plan view). The second gate insulation regions GIR2 may continuously pass through the first line part having a first width W1 of the electrode structure ST and the second line part having a second width W2, which is less than the first width W1, of the electrode structure ST.

A bottom of electrode structure ST may include gate openings OP (e.g., five gate openings OP). Each of the electrode structures ST may thus include a plurality of ground select gate electrodes (see, e.g., GGE of FIG. 6) separated from each other. For example, when the bottom of the electrode structure ST includes five gate openings OP, the electrode structures ST may each include six ground select electrodes.

Figure 12:
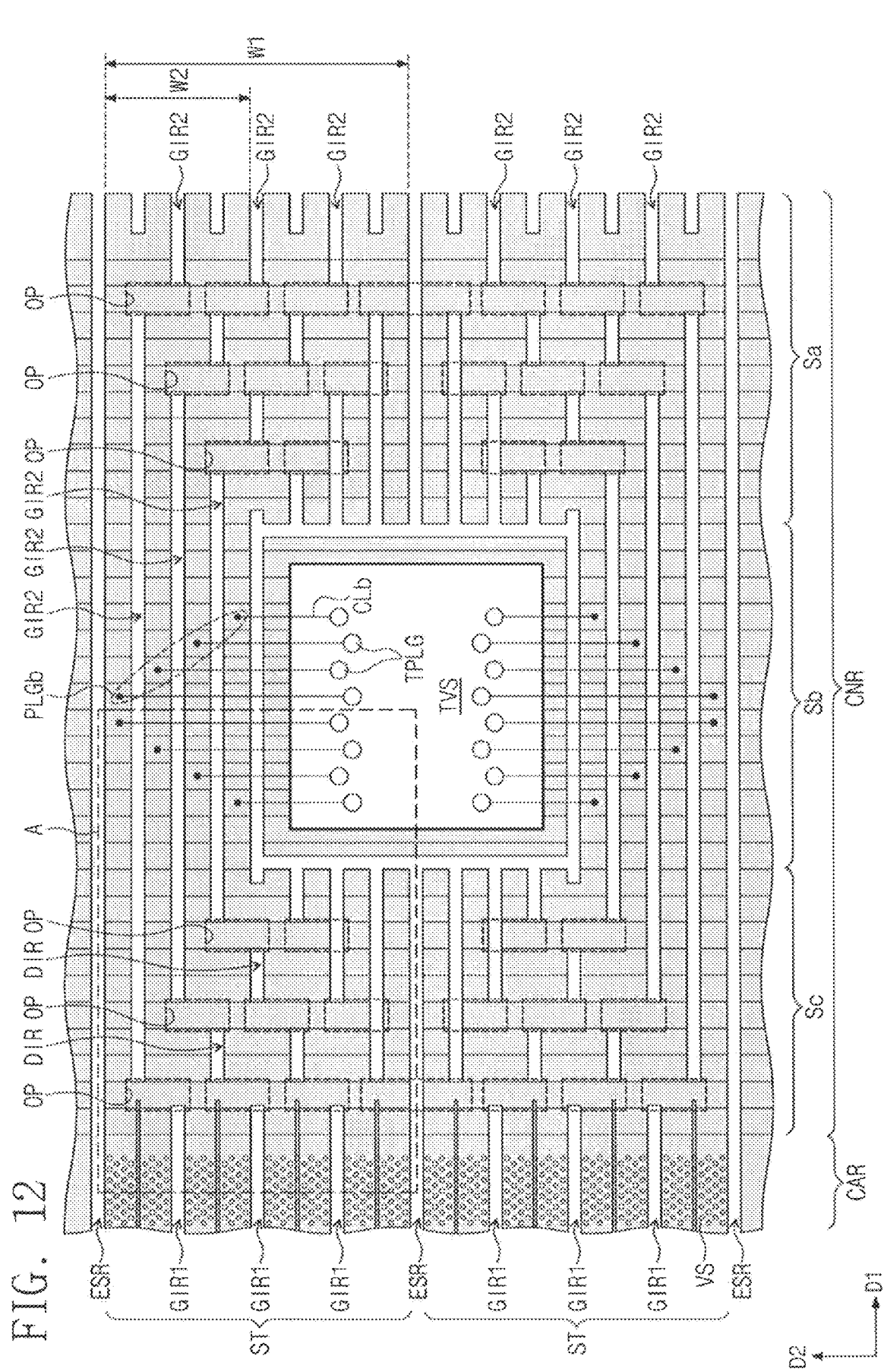
FIG. 12 is a plan view of a cell array structure of a three-dimensional semiconductor memory device according to an exemplary embodiment of the present inventive concept.
Figure 13:
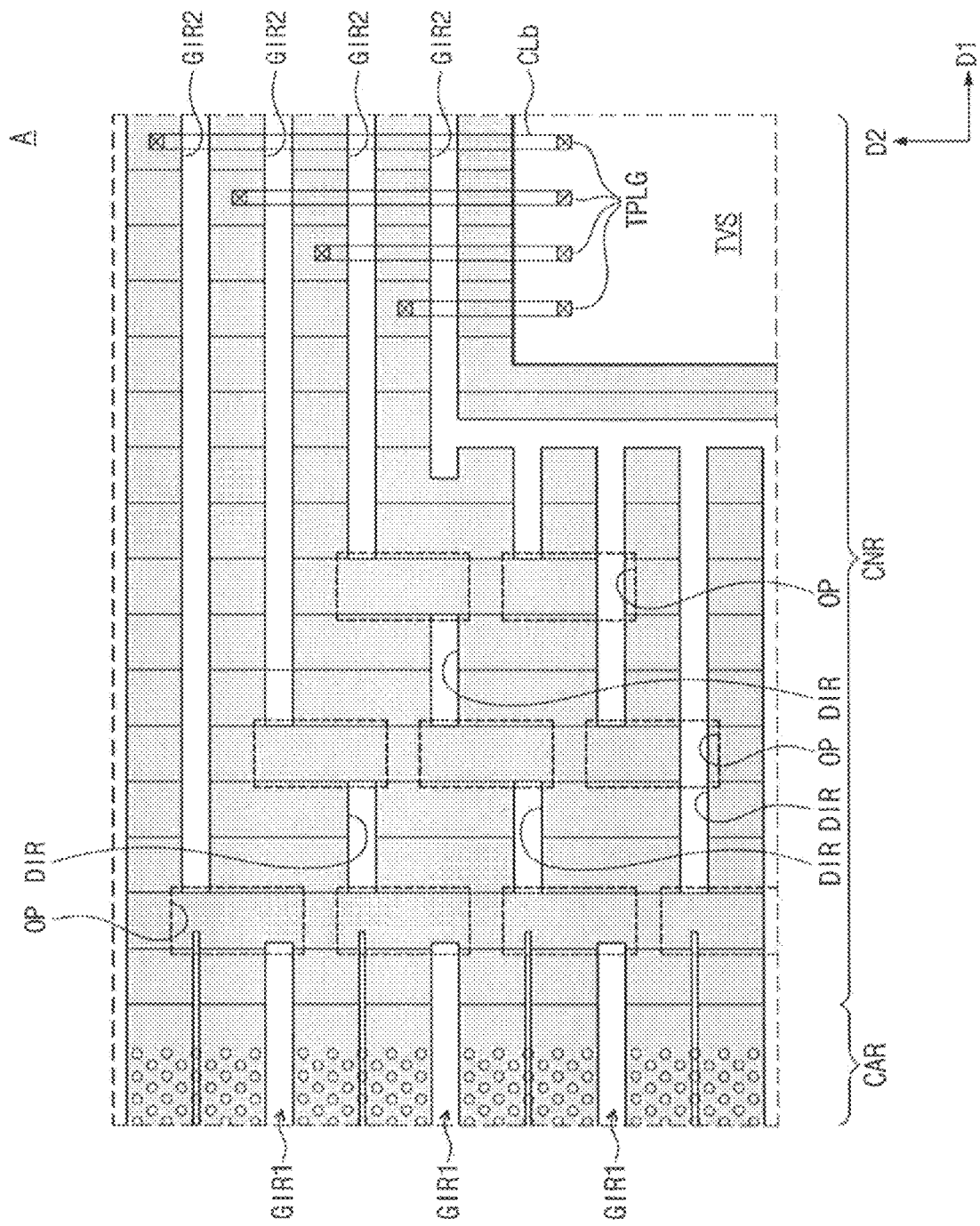
FIG. 13 is an enlarged view of section A of FIG. 12.
Figure 14:
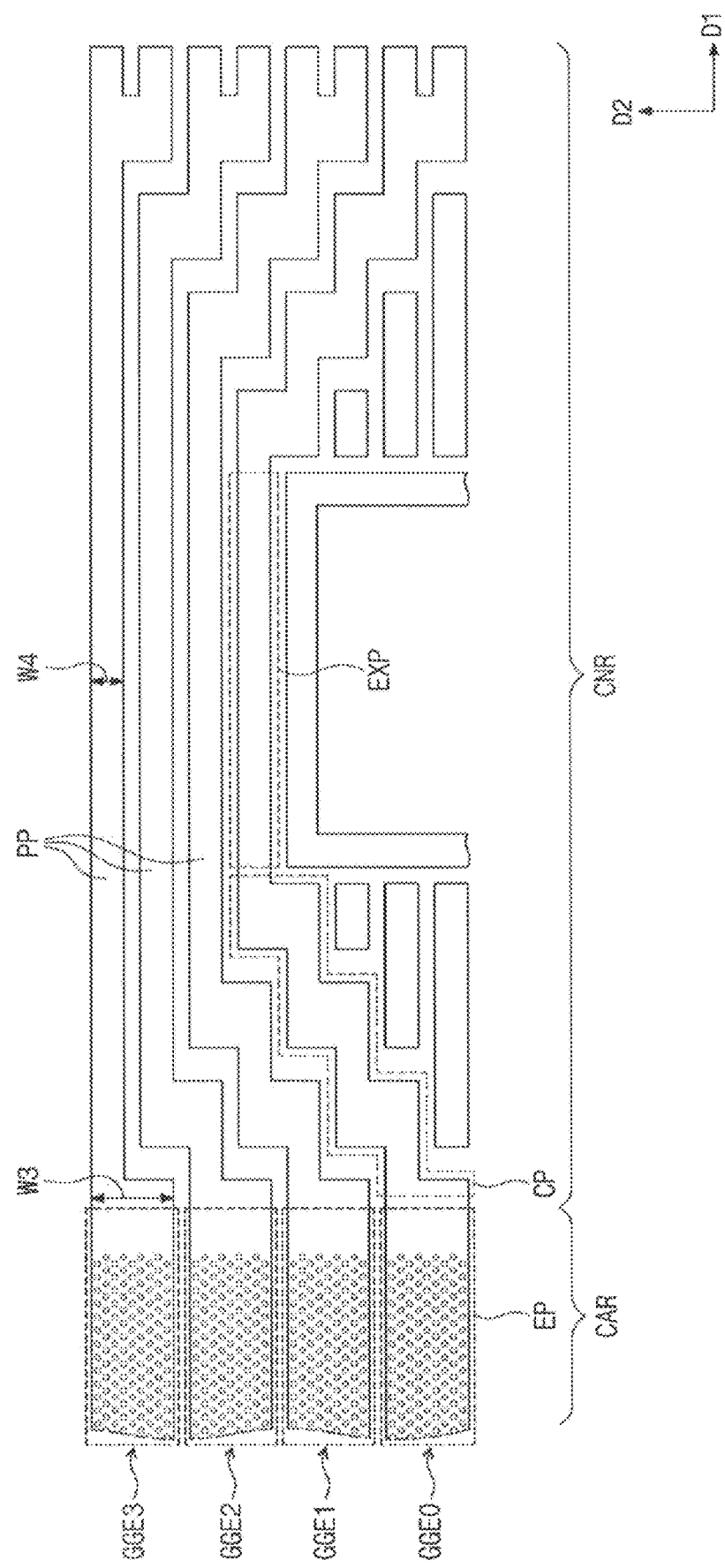
FIG. 14 is a plan view of ground select gate electrodes included in an electrode structure according to an exemplary embodiment of the present inventive concept.
Figure 15:
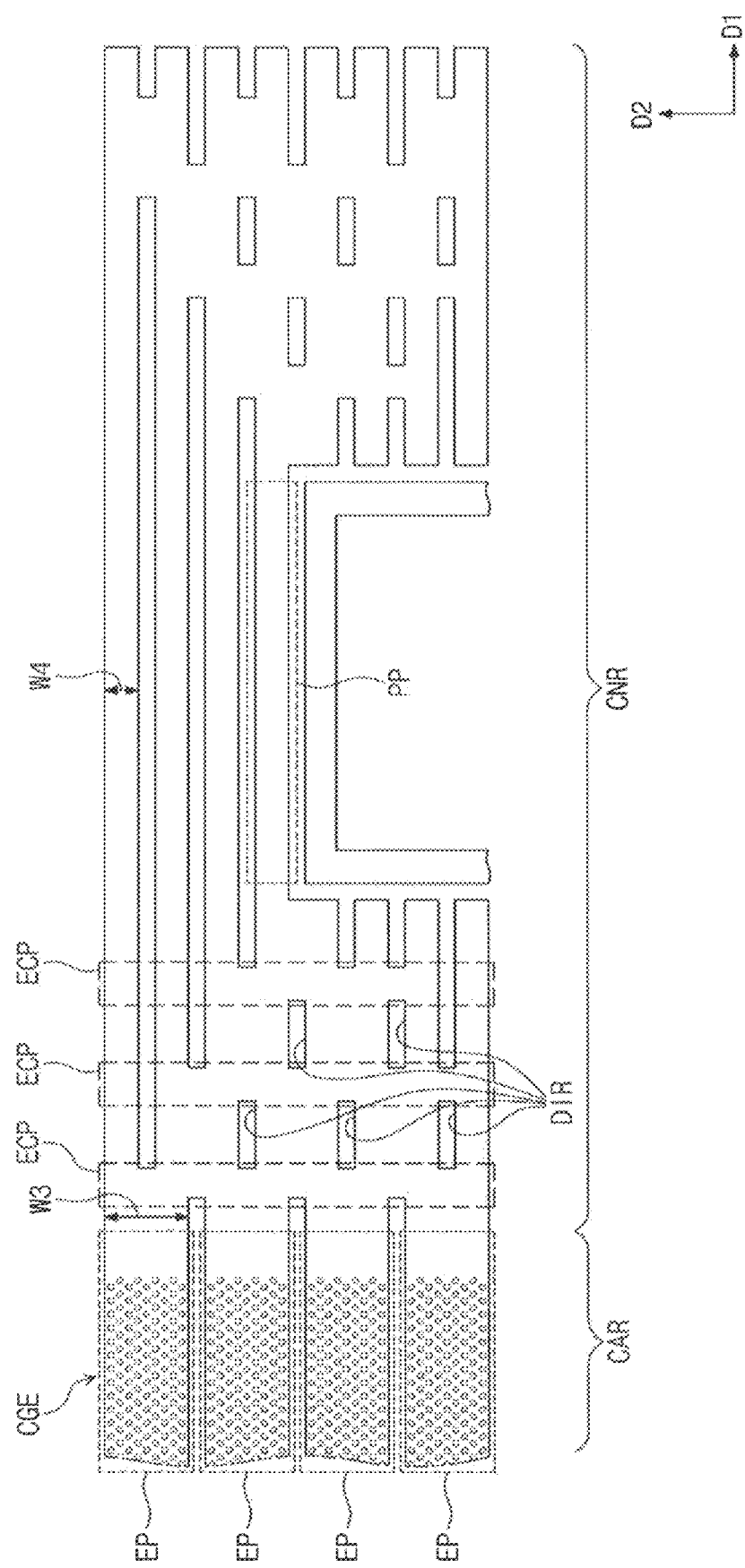
FIG. 15 is a plan view of a cell gate electrode included in an electrode structure according to an exemplary embodiment of the present inventive concept.

FIG. 12 is a plan view of a cell array structure of a three-dimensional semiconductor memory device according to an exemplary embodiment of the present inventive concept. FIG. 13 is an enlarged view of section A of FIG. 12. FIG. 14 is a plan view of ground select gate electrodes included in an electrode structure according to an exemplary embodiment of the present inventive concept. FIG. 15 is a plan view of a cell gate electrode included in an electrode structure according to an exemplary embodiment of the present inventive concept.

Duplicative descriptions of technical features or components that are the same or substantially the same as those described above may be omitted below.

Referring to FIGS. 12 and 13, the electrode separation regions ESR may separate the electrode structures ST from each other in the second direction D2. The electrode separation regions ESR may extend in the first direction D1 while having a substantially uniform width, and one of the electrode separation regions ESR may include a ring-shaped portion surrounding the through via structure TVS.

On the cell array region CAR, the first gate insulation regions GIR1 may penetrate the first line part having the first width W1 of the electrode structure ST. The first gate insulation regions GIR1 may extend substantially parallel to each other in the first direction D1 while being spaced apart from each other at a first interval.

On the connection region CNR, the second gate insulation regions GIR2 may penetrate the second line part having the second width W2, which is less than the first width W1, of the electrode structure ST. The second gate insulation regions GIR2 may extend parallel to each other in the first direction D1 while having substantially the same widths as those of the first gate insulation regions GIR1. An interval between the second gate insulation regions GIR2 may be less than an interval between the first gate insulation regions GIR1. The second gate insulation regions GIR2 may have different lengths from each other in the first direction D1.

On the connection region CNR, the dummy gate insulation regions DIR may penetrate the first line part having the first width W1 of the electrode structure ST. The dummy gate insulation regions DIR may be spaced apart in the first direction D1 from the second gate insulation regions GIR2. One or more of the dummy gate insulation regions DIR may be connected to the ring-shaped portion of the electrode separation region ESR.

On the connection region CNR, the electrode structure ST may include the gate openings OP at bottoms of the electrode structure ST. Each of the gate openings OP may have a bar (e.g., rectangular) shape having a major axis in the second direction D2. The gate openings OP may have lengths in the second direction D2 less than an interval between the first gate insulation regions GIR1.

The gate openings OP may be provided spaced apart from each other in second direction D2, and the gate openings OP arranged along the second direction D2 may be arranged in a single row. A plurality of the rows may be provided spaced apart in the first direction D1, and the number of the gate openings OP in each row may be different from each other.

Each of the electrode structures ST may be provided with the gate openings OP provided at the bottom thereof, the first and second gate insulation regions GIR1 and GIR2, and the dummy gate insulation regions DIR, such that the lowermost ground select gate electrodes GGE of each of the electrode structures ST may be spaced from each other in the second direction D2 (see, e.g., FIG. 13) and electrically separated from each other. Referring to FIG. 14, each of the electrode structures ST may include, at its bottom, four ground select gate electrodes GGE0, GGE1, GGE2, and GGE3 separated from each other. Each of the ground select gate electrodes GGE0 to GGE3 may include an electrode portion EP disposed on the cell array region CAR and a pad portion disposed on the connection region CNR. The electrode portion EP may extend in the first direction D1 while having the third width W3. The pad portion may include the connection portion CP extending in the second direction D2 from the electrode portion EP and an extension portion EXP extending in the first direction D1 from the connection portion CP while having the fourth width W4 less than the third width W3. The extension portions EXP of the ground select gate electrodes GGE0 to GGE3 may have different lengths from each other in the first direction D1.

Referring to FIG. 15, in each of the electrode structures ST, each of the cell gate electrodes CGE may include electrode portions EP extending in the first direction D1 while having a third width W3 on the cell array region CAR, pad portions PP extending in the first direction D1 while having on the connection region CNR the fourth width W4 less than the third width W3, and electrode connection portions ECP through which the electrode portions EP and the pad portions PP are connected to each other. As an example, the electrode portions EP and the pad portions PP may be a single continuous body (e.g., having portions extending in the first and second directions D1 and D2). The electrode connection portions ECP of the cell gate electrode CGE may overlap the gate openings OP (see, e.g., FIGS. 12 and 13). The dummy gate insulation regions DIR may be provided between the electrode connection portions ECP.

Figure 16:
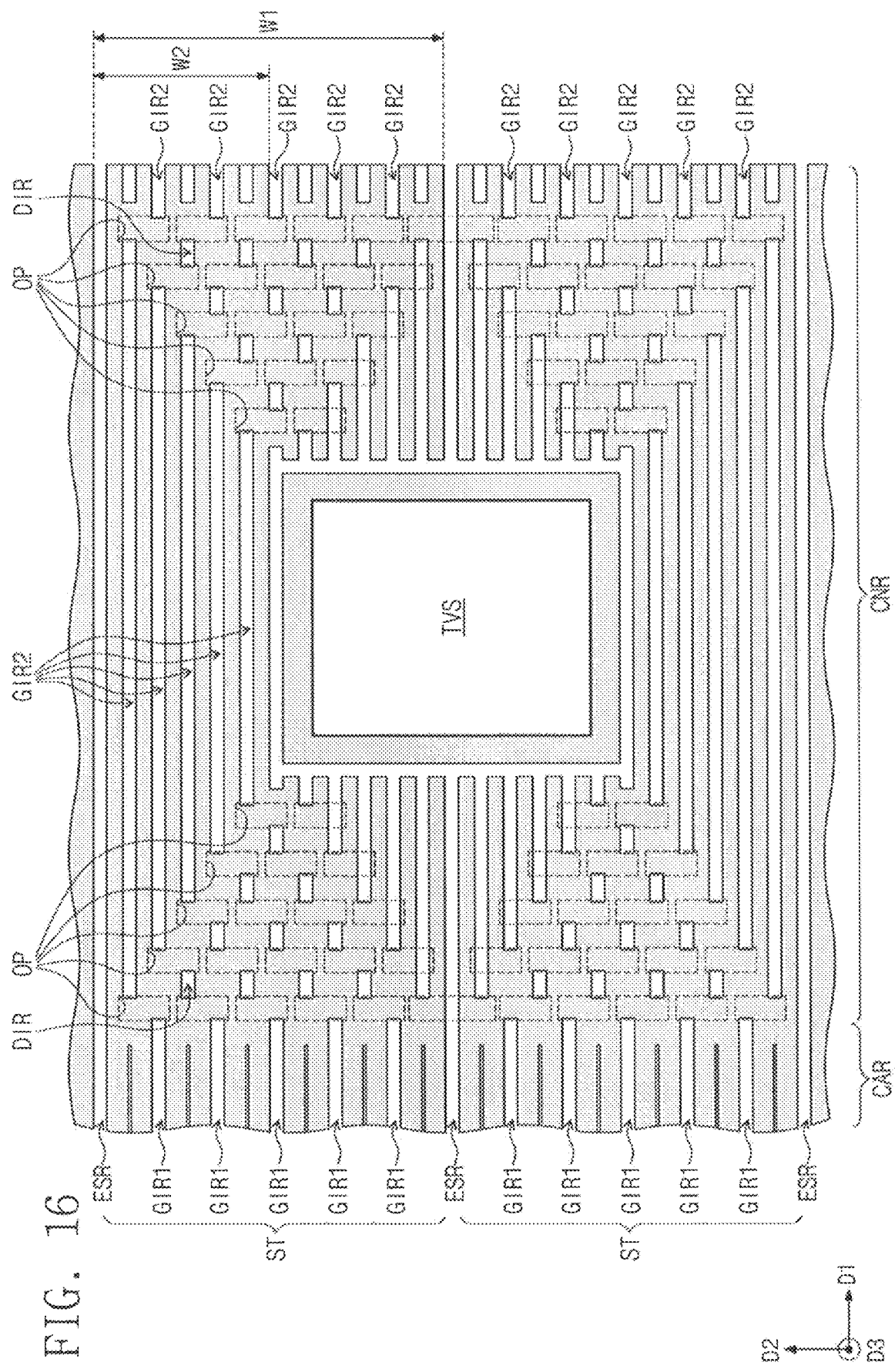
FIG. 16 is a plan view of a three-dimensional semiconductor memory device according to an exemplary embodiment of the present inventive concept.

FIG. 16 is a plan view of a three-dimensional semiconductor memory device according to an exemplary embodiment of the present inventive concept.

Referring to FIG. 16, the cell array region CAR may be provided with five first gate insulation regions GIR1, and the connection region CNR may be provided with five second gate insulation regions GIR2. The first and second gate insulation regions GIR1 and GIR2 may extend in the first direction D1 while having substantially the same width, and an interval between the second gate insulation regions GIR2 may be less than an interval between the first gate insulation regions GIR1. Each of the electrode structures ST may be provided with five rows each of which includes the gate openings OP arranged along the second direction D2. The rows of the gate openings OP may be provided therebetween with the dummy gate insulation regions DIR each having a major axis in the first direction D1.

As an example, each of the electrode structures ST may include six ground select gate electrodes GGE separated from each other at a bottom thereof.

FIGS. 17A, 18A, 19A, 20A, 21, and 22 are cross-sectional views of a method of manufacturing a three-dimensional semiconductor memory device according to an exemplary embodiment of the present inventive concept. FIGS. 17B, 18B, 19B, 20B, 17C, 18C, 19C and 20C are plan views of a method of manufacturing a three-dimensional semiconductor memory device according to an exemplary embodiment of the present inventive concept.

Figure 17A:
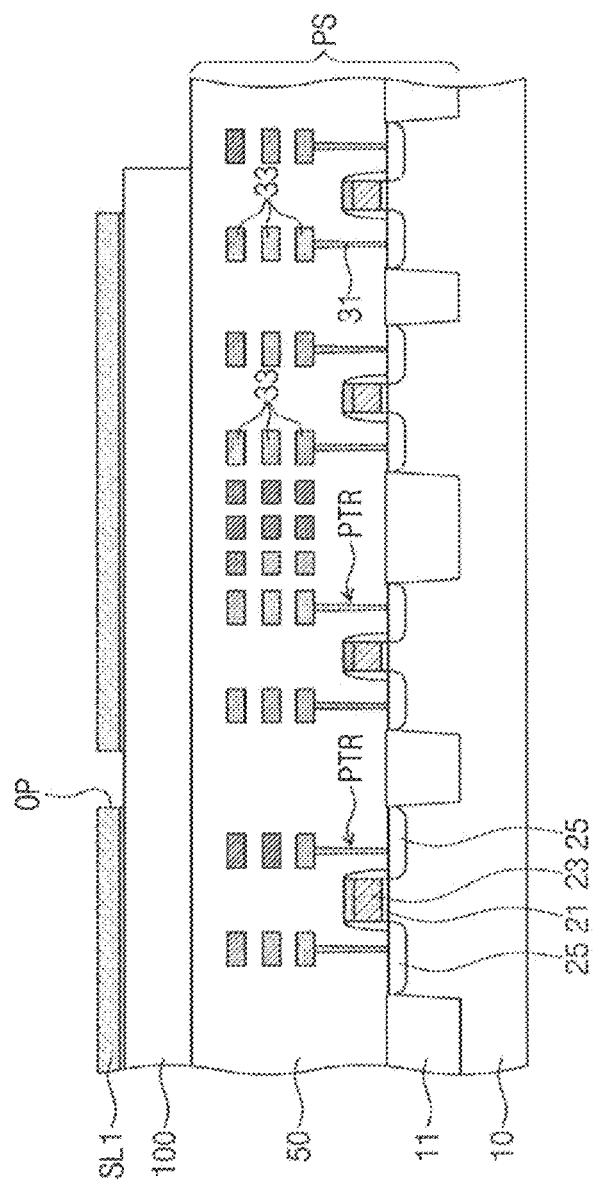
Figure 17B:
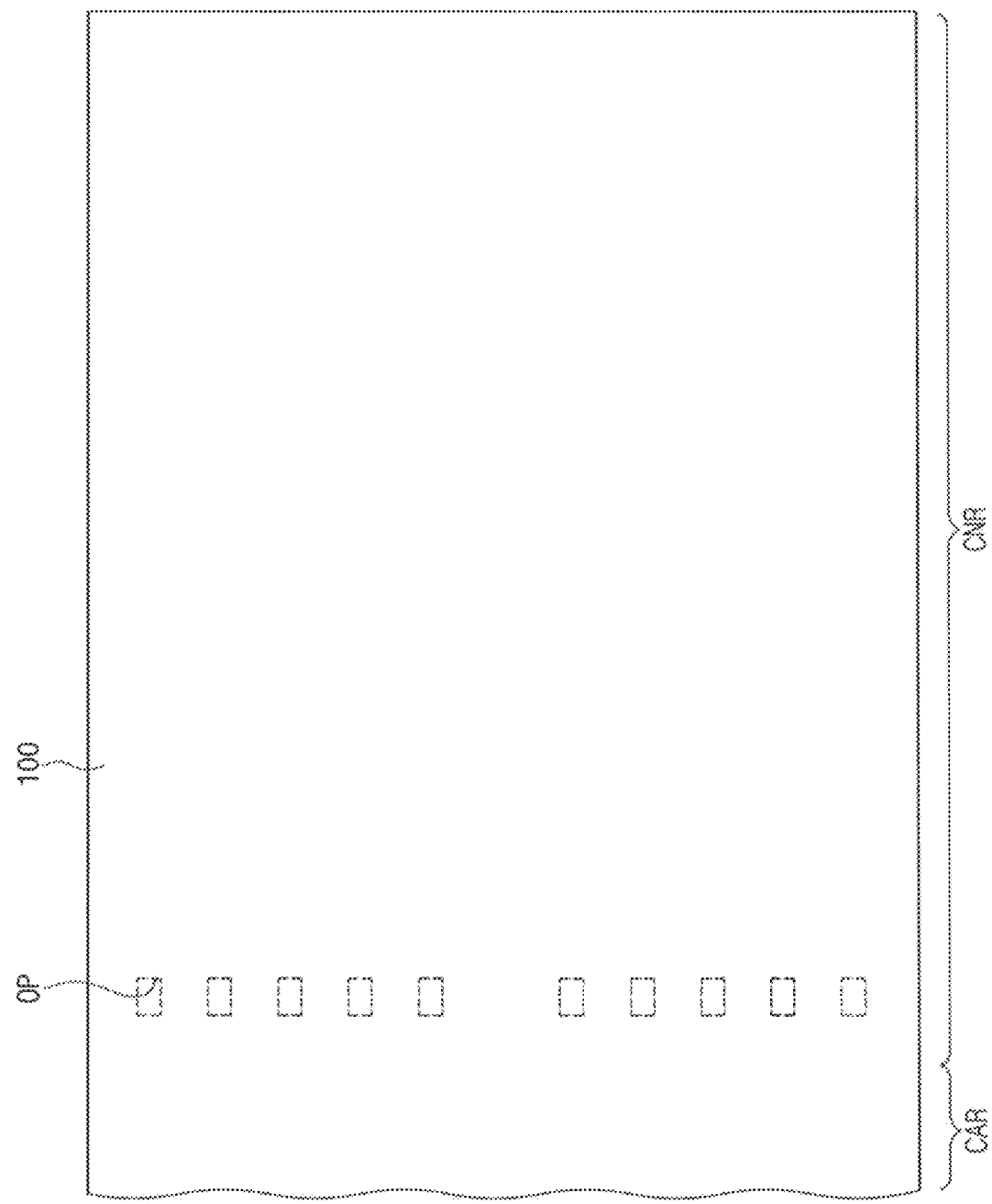
FIGS. 17B, 18B, 19B, 20B, 17C, 18C, 19C and 20C are plan views of a method of manufacturing a three-dimensional semiconductor memory device according to an exemplary embodiment of the present inventive concept.
Figure 17C:
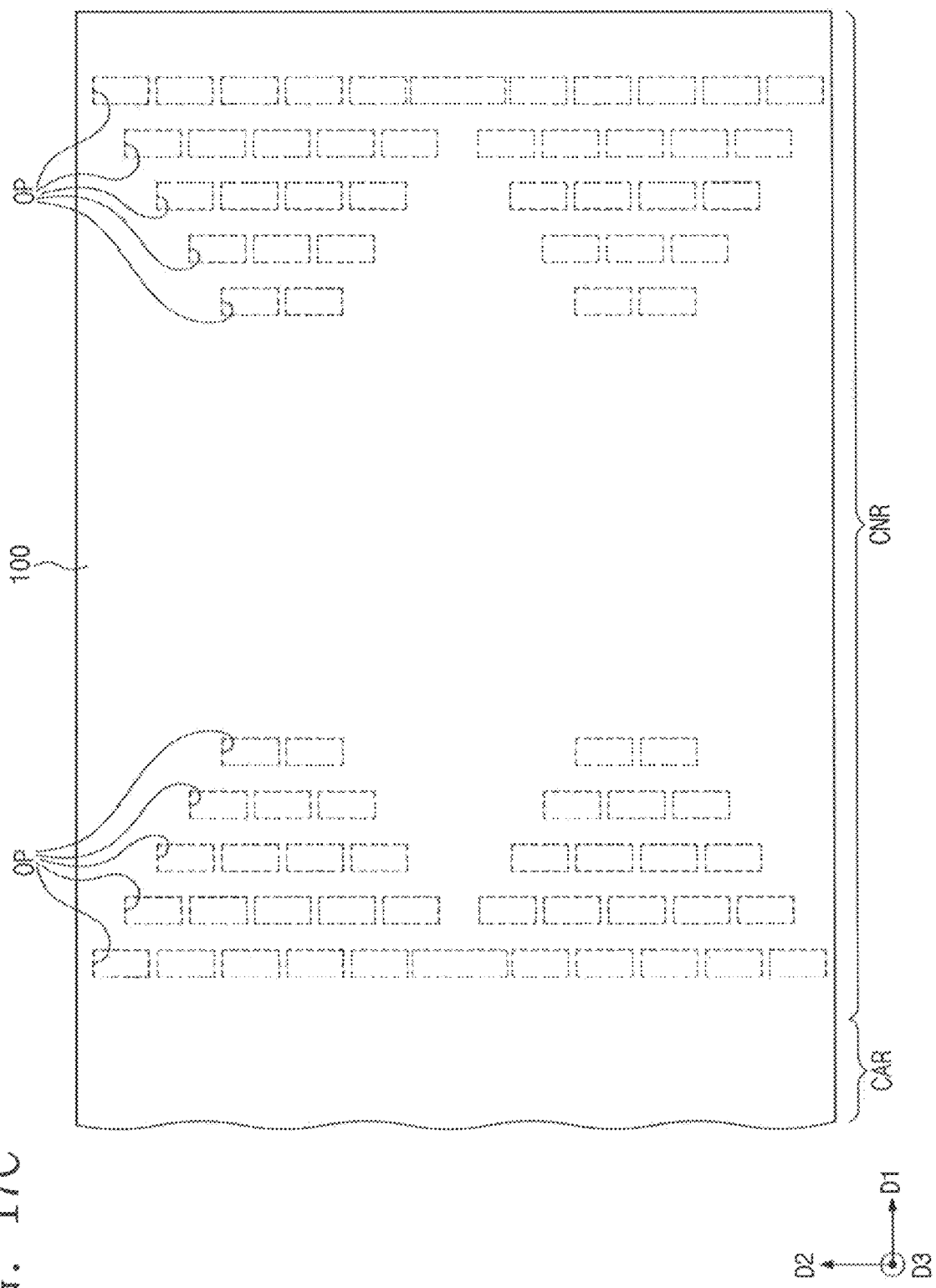

Referring to FIGS. 17A, 17B, and 17C, the peripheral logic structure PS may be formed on the semiconductor substrate 10. The formation of the peripheral logic structure PS may include forming peripheral logic circuits PTR on the semiconductor substrate 10, forming peripheral line structures 31 and 33 connected to the peripheral logic circuits PTR, and forming the lower buried insulating layer 50.

The horizontal semiconductor layer 100 may be formed on the lower buried insulating layer 50. The horizontal semiconductor layer 100 may include the cell array region CAR and the connection region CNR. For example, a polysilicon layer may be deposited to cover an entire surface of the lower buried insulating layer 50, and then the polysilicon layer may be patterned to form the horizontal semiconductor layer 100. When the polysilicon layer is deposited, first conductivity impurities may be doped into the polysilicon layer. The horizontal semiconductor layer 100 may be patterned to partially expose the lower buried insulating layer 50.

A lower sacrificial layer SL1 having gate openings OP may be formed on the horizontal semiconductor layer 100. The gate openings OP may be formed by etching the lower sacrificial layer SL1 so as to partially expose the horizontal semiconductor layer 100 on the connection region CNR. The gate openings OP may be formed to be spaced apart from each other in the second direction D2 (see, e.g., FIG. 17B). Alternatively, referring to FIG. 17C, the gate openings OP may be formed in such a way that a plurality of rows each including the gate openings OP disposed along the second direction D2 may be arranged in the first direction D1. The number of the gate openings OP included in each row may be different from each other. The plurality of rows including the gate openings OP may be formed symmetrically to each other on the connection region.

Figure 18A:
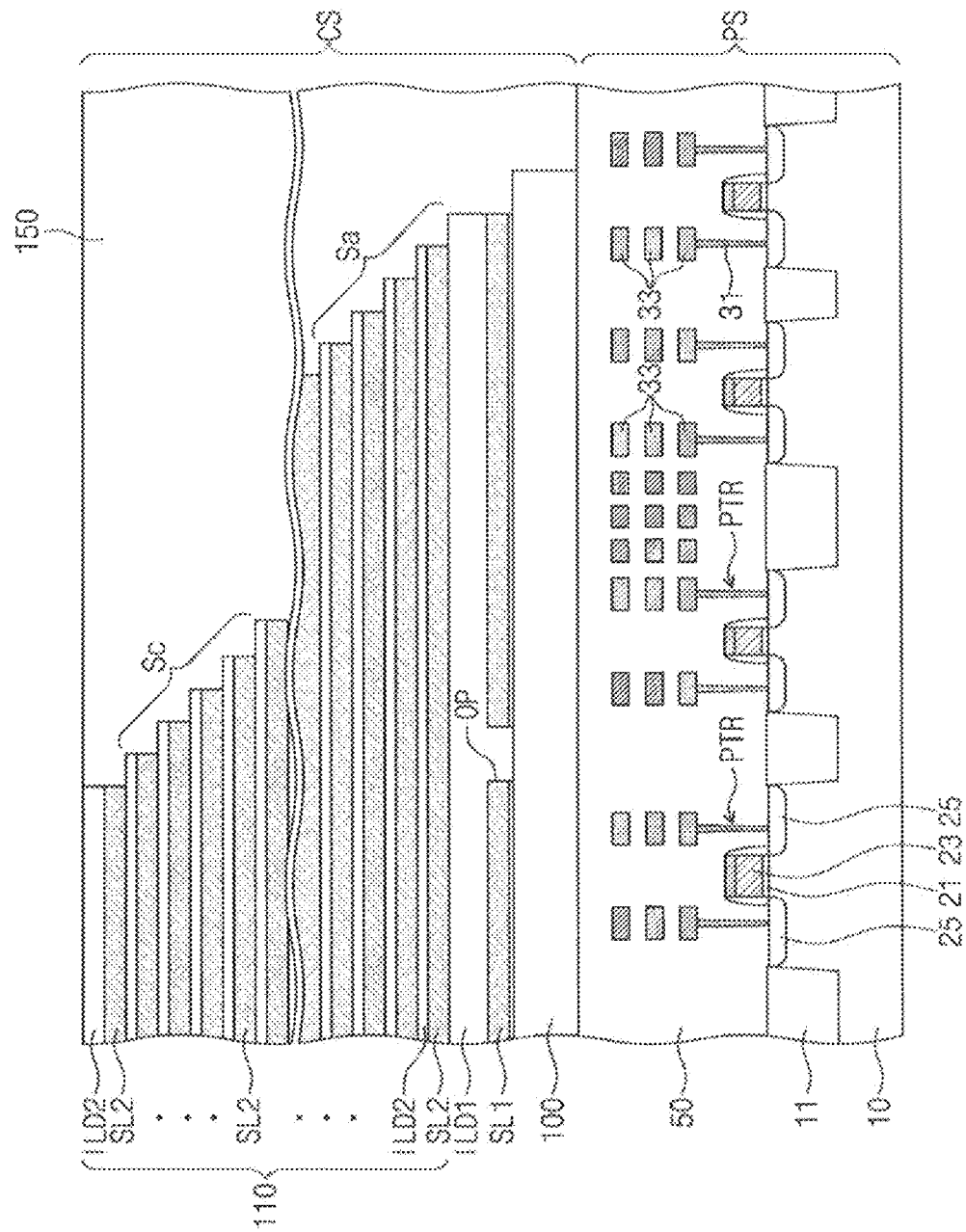
Figure 18B:
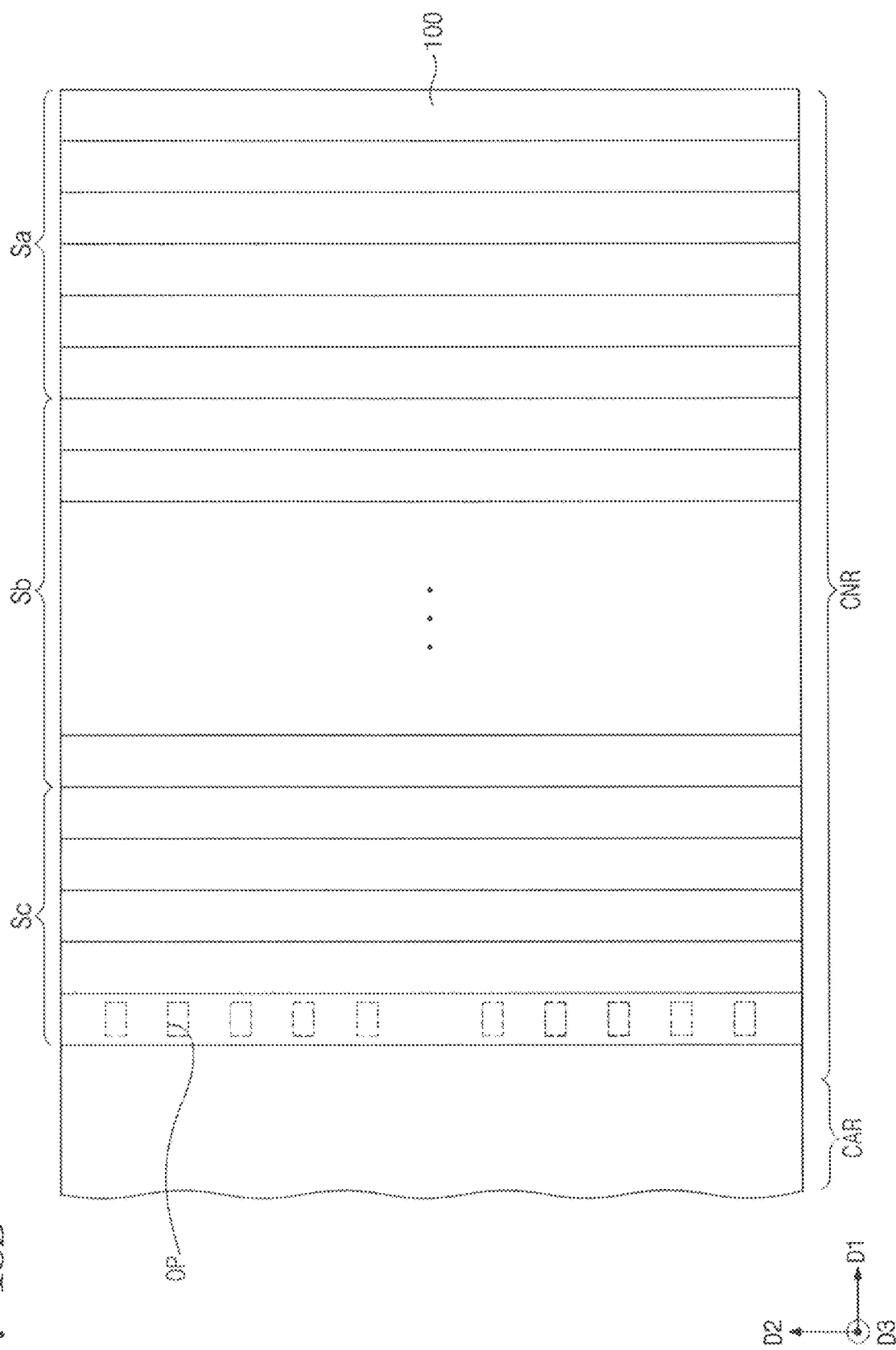
Figure 18C:
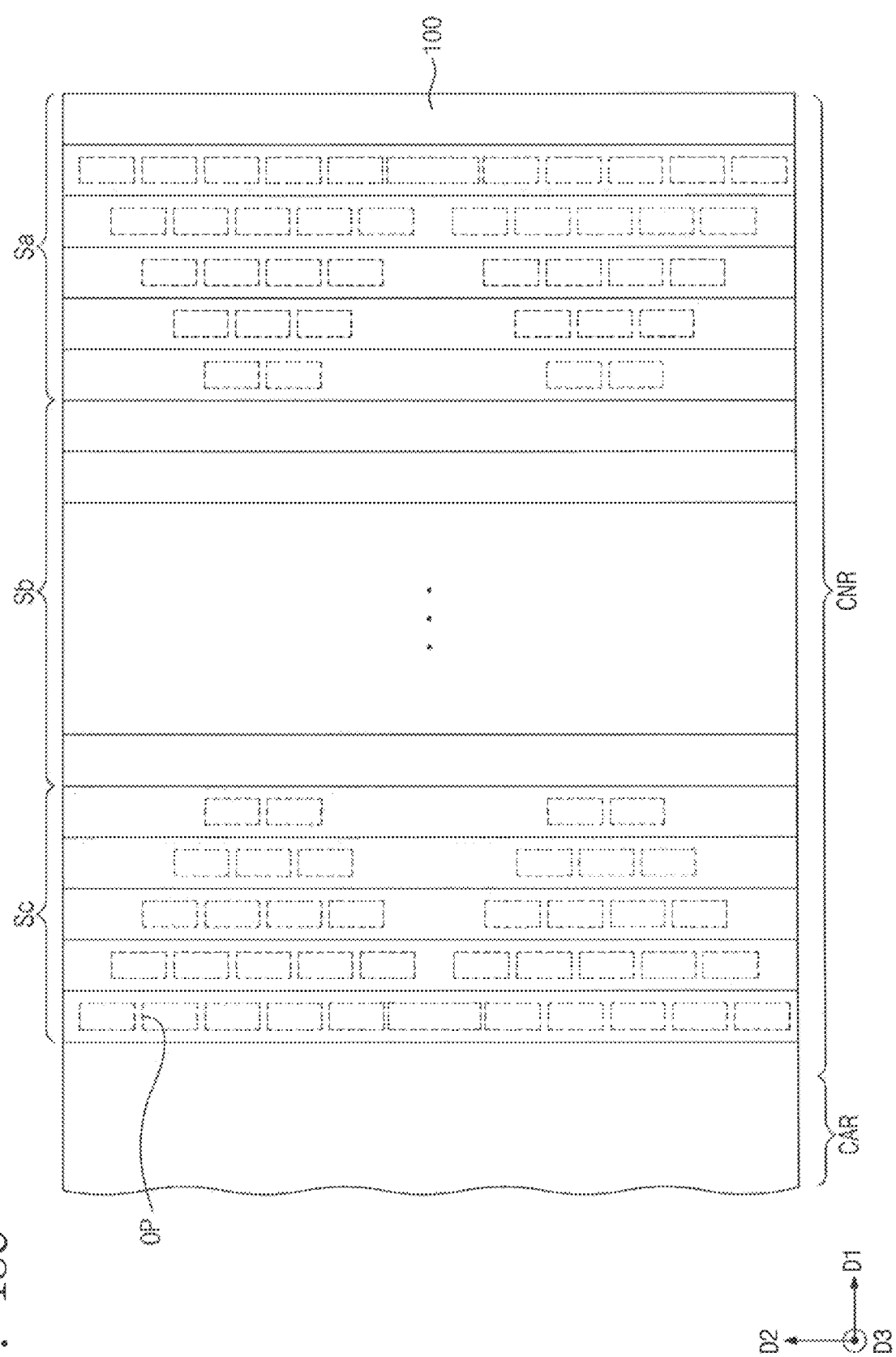

Referring to FIGS. 18A, 18B, and 18C, the lower insulating layer ILD 1 may be formed to cover an entire surface of the horizontal semiconductor layer 100. The lower insulating layer ILD1 may have a planarized top surface and may fill the gate openings OP formed in the lower sacrificial layer SL1.

Upper sacrificial layers SL2 and upper insulating layers ILD2 may be vertically and alternately stacked to form a mold structure 110 on the lower insulating layer ILD1. For example, the lower and upper sacrificial layers SL1 and SL2 may include a silicon nitride layer, and the lower and upper insulating layers ILD1 and ILD2 may include a silicon oxide layer.

The mold structure 110 may have a stepwise structure on the connection region CNR of the horizontal semiconductor layer 100. For example, the formation of the mold structure 110 may include forming on an entire surface of the lower insulating layer ILD1 a thin-layer structure where the upper sacrificial layers SL2 and the upper insulating layers ILD2 are vertically and alternately stacked and then performing a trimming process on the thin-layer structure. The trimming process may include forming a mask pattern to cover the thin-layer structure on the cell array region CAR and the connection region CNR, etching a portion of the thin-layer structure, and reducing a horizontal area of the mask pattern. When the trimming process is carried out, the etching and reducing steps may be alternately and repeatedly performed. The trimming process may cause the mold structure 110 to have lower, intermediate, and upper stepwise structures Sa, Sb, and Sc in the cell array region CAR. Referring to FIG. 18B, the upper stepwise structure Sc of the mold structure 110 may overlap the gate openings OP. Alternatively, referring to FIG. 18C, the upper and lower stepwise structures Sc and Sa of the mold structure 110 may overlap the gate openings OP.

After the mold structure 110 is formed, an upper buried insulating layer 150 may be formed on the entire surface of the horizontal semiconductor layer 100. The upper buried insulating layer 150 may have a substantially planarized top surface. The upper buried insulating layer 150 may be formed by forming an insulating layer thicker than the mold structure 110 and then performing a planarization process on the insulating layer.

Figure 19A:
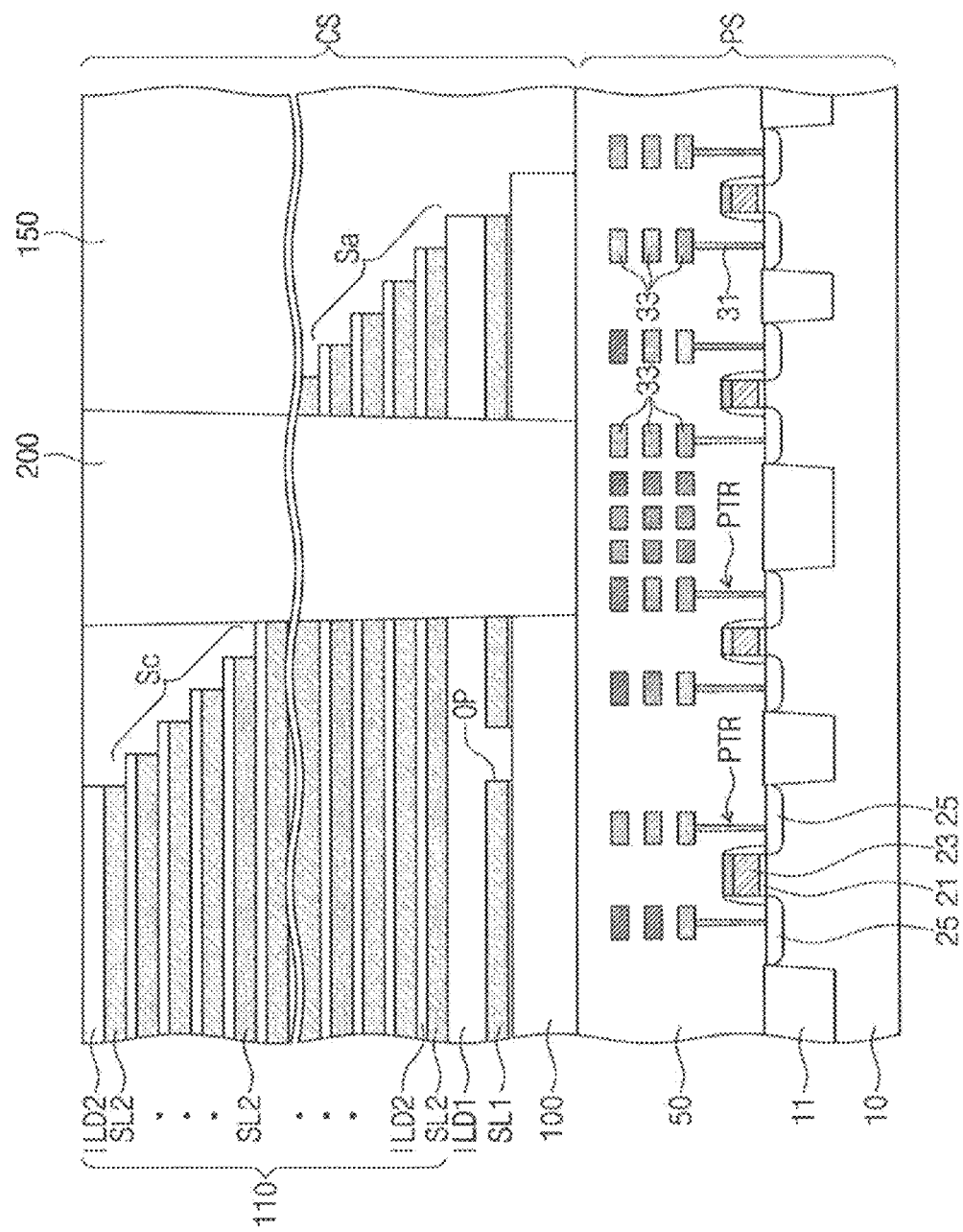
Figure 19B:
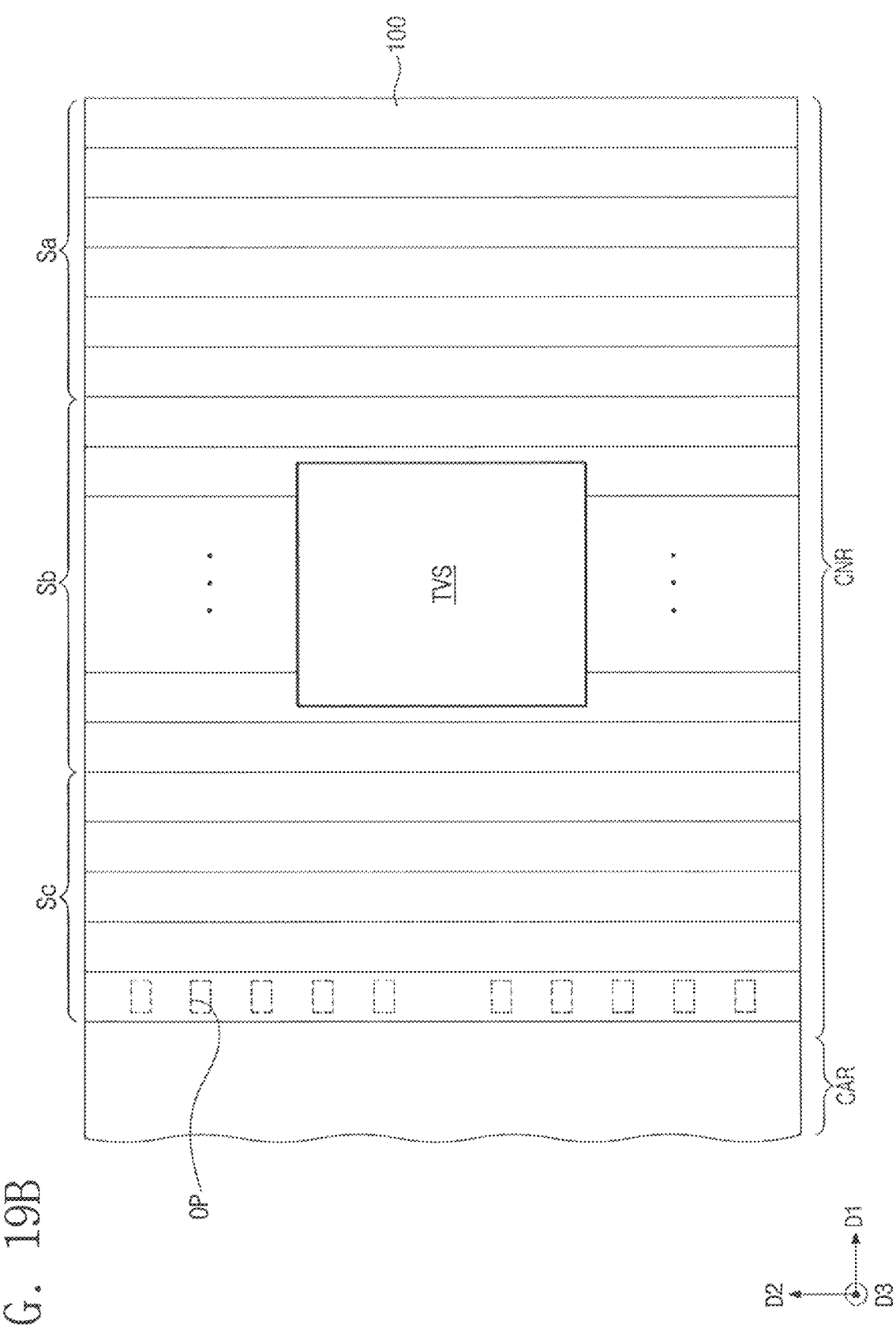
Figure 19C:
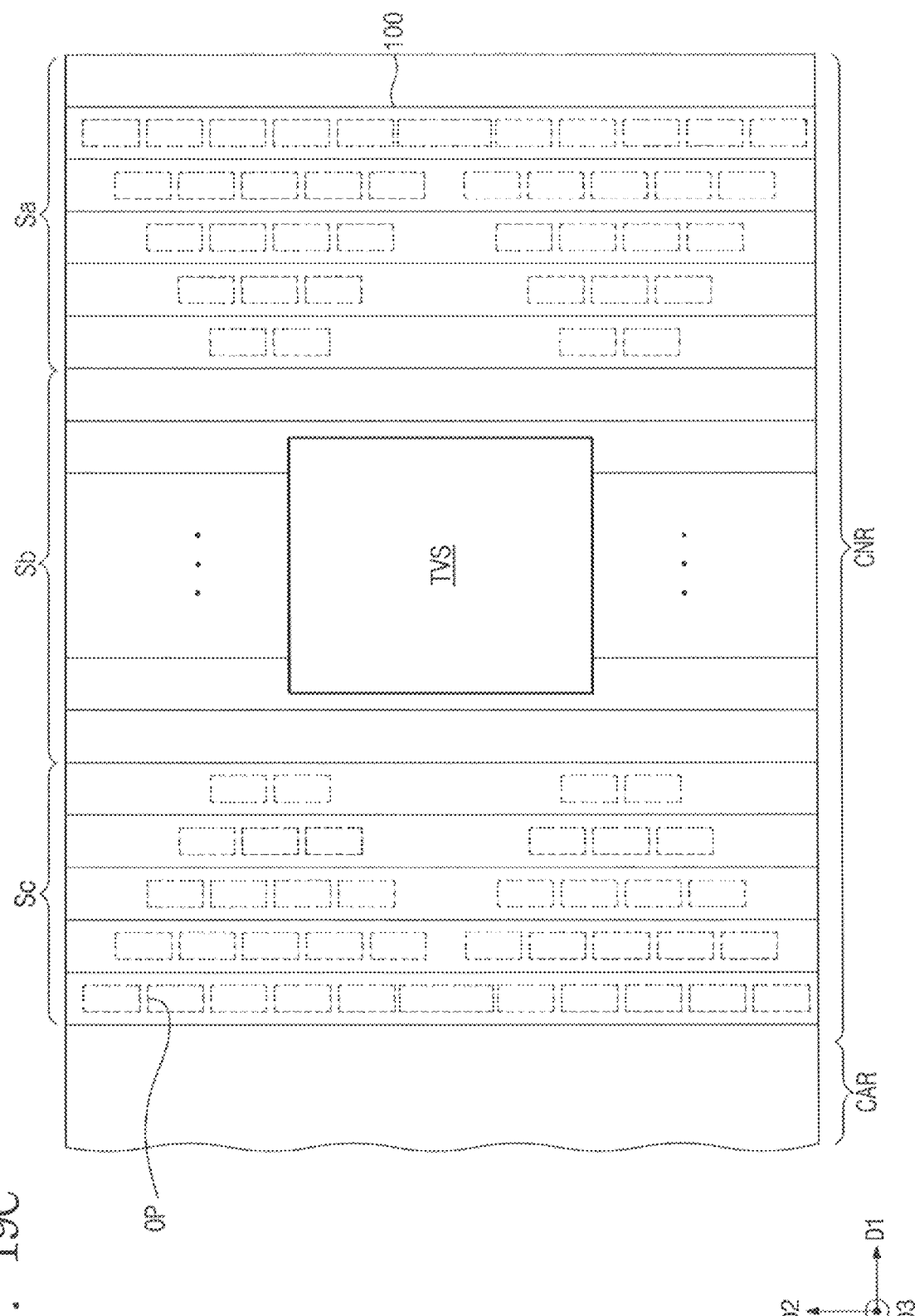

Referring to FIGS. 19A, 19B, and 19C, a through insulation pattern 200 may be formed to penetrate the mold structure 110, the lower sacrificial layer SL1, and the horizontal semiconductor layer 100. For example, the through insulation pattern 200 may penetrate the intermediate stepwise structure Sb of the mold structure 110. The through insulation pattern 200 may be spaced apart from the gate openings OP formed in the lower sacrificial layer SL1.

The formation of the through insulation pattern 200 may include forming on the upper buried insulating layer 150 using a mask pattern having an opening on the connection region CNR as an etching mask to anisotropically etch the mold structure 110, the lower sacrificial layer SL1, and the horizontal semiconductor layer 100 to form a through hole exposing the lower buried insulating layer 50, forming an insulating layer to fill the through hole, and then planarizing the insulating layer to expose a top surface of the mold structure 110.

Figure 20A:
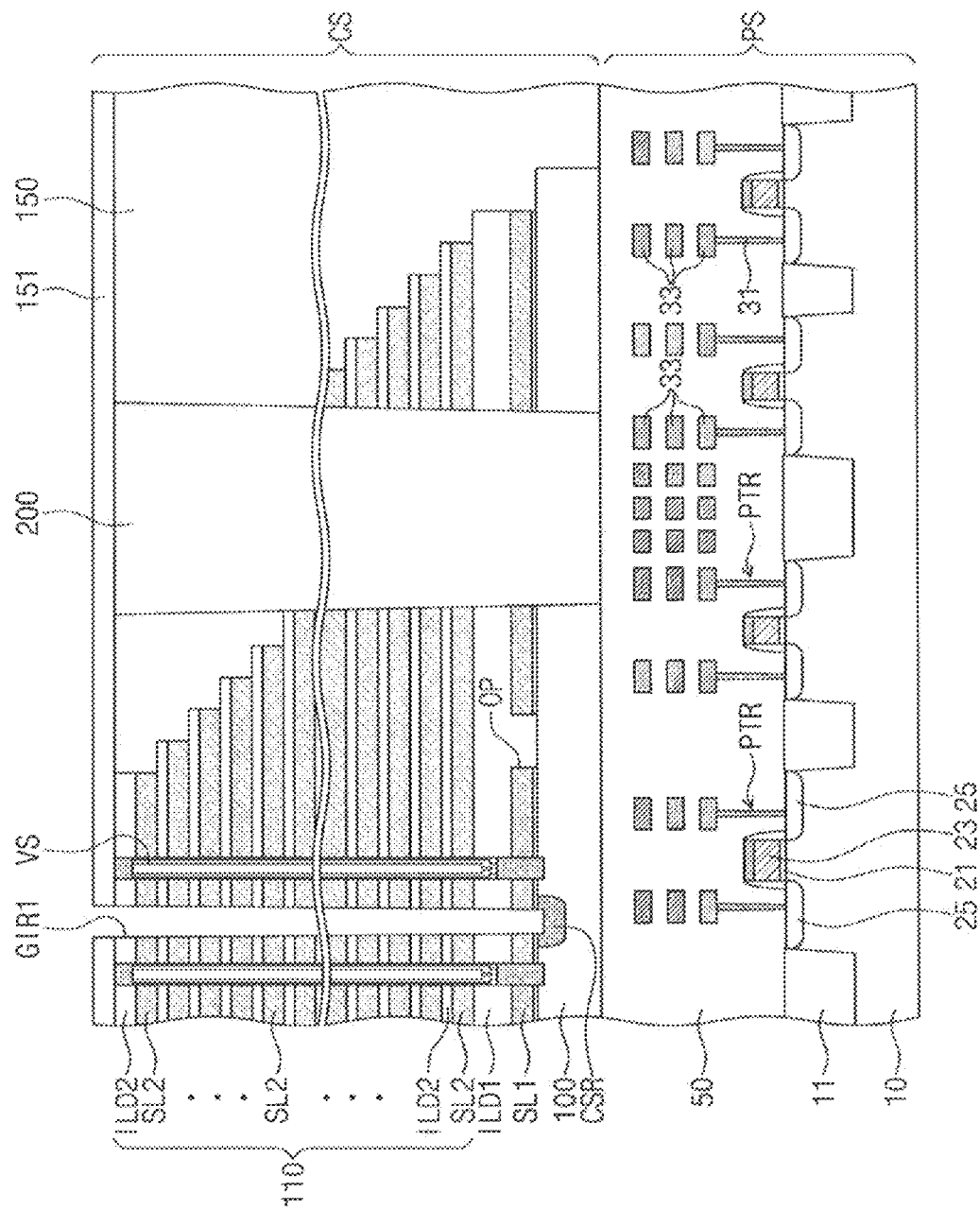
Figure 20B:
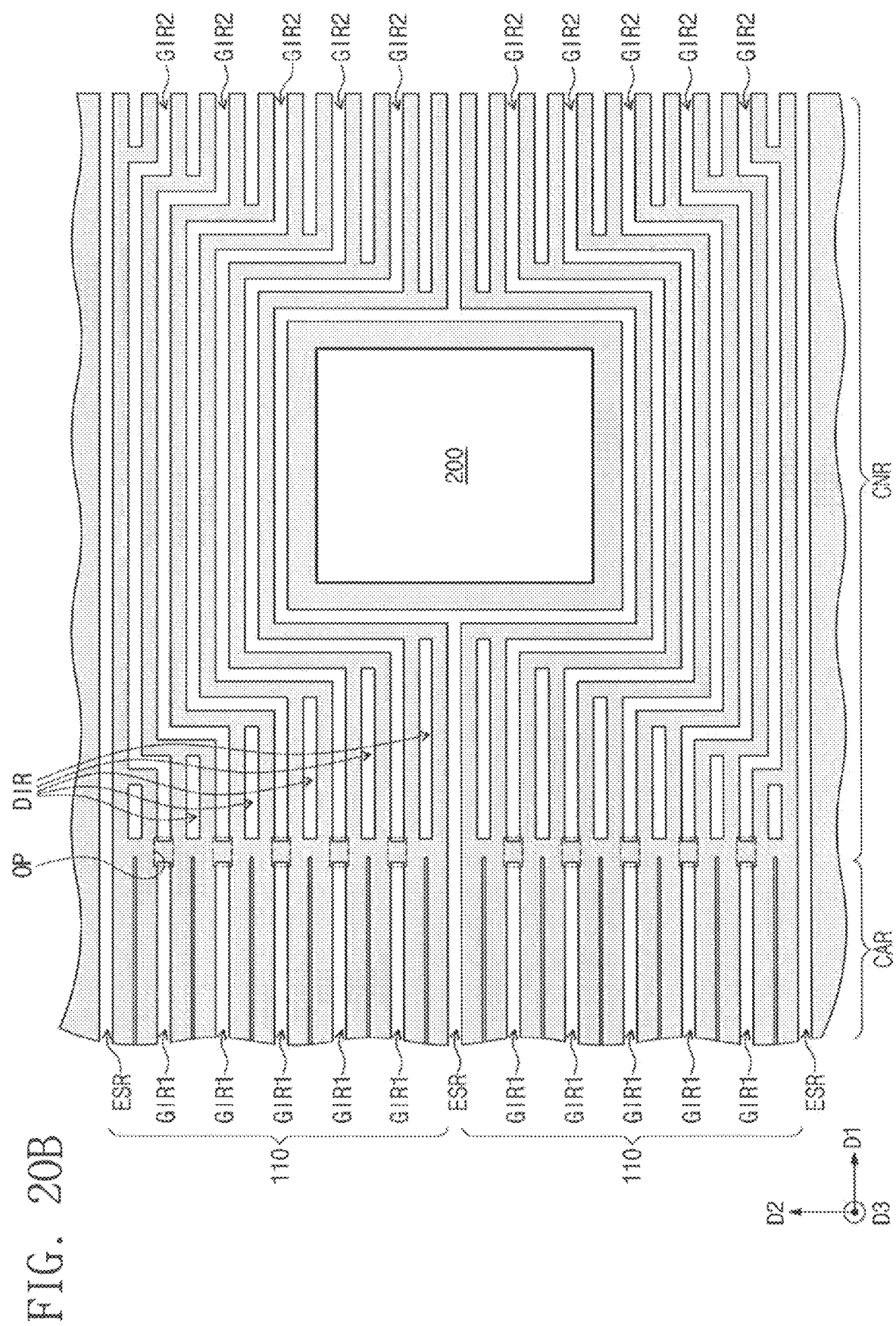
Figure 20C:
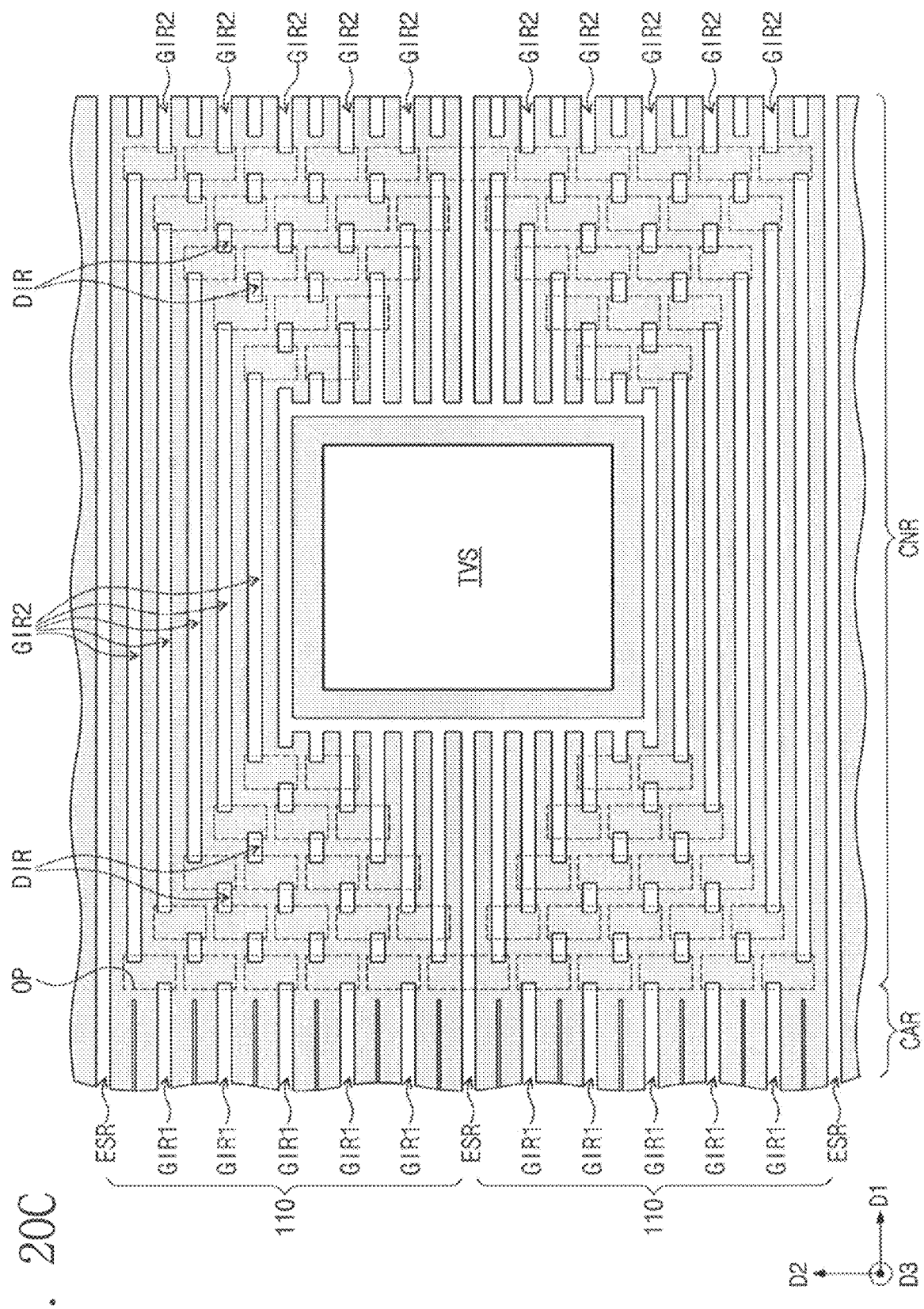

Referring to FIGS. 20A, 20B, and 20C, vertical structures VS may be formed on the horizontal semiconductor layer 100 of the cell array region CAR. The vertical structures VS may penetrate the mold structure 110, the lower insulating layer ILD1, and the lower sacrificial layer SL1.

The formation of the vertical structures VS may include forming vertical holes exposing the horizontal semiconductor layer 100 that penetrate the mold structure 110, the lower insulating layer ILD2, and the lower sacrificial layer S1, and then forming the lower semiconductor pattern LSP and the upper semiconductor pattern USP in each of the vertical holes (see, e.g., FIG. 7A). Before the upper semiconductor pattern USP is formed, the vertical insulating pattern VP may be formed in each of the vertical holes (see, e.g., FIG. 7A). The formation of the vertical insulating pattern VP may include depositing a vertical insulating layer and a first semiconductor layer to a uniform thicknesses on inner sidewalls of the vertical holes in each of which the lower semiconductor pattern LSP is formed, and then performing an etch-back process (or an anisotropic etching process) on the vertical insulating layer and the first semiconductor layer until a portion of the lower semiconductor pattern LSP is exposed.

Referring back to FIGS. 20A, 20B, and 20C, the first interlayer dielectric layer 151 may be formed on the upper buried insulating layer 150, and may cover top surfaces of the vertical structures VS. After the first interlayer dielectric layer 151 is formed, first and second gate insulation regions GIR1 and GIR2, dummy gate insulation regions DIR, and electrode separation regions ESR may be formed to penetrate the mold structure 110 and the lower sacrificial layer SL1. The mold structure 110 may be divided into a plurality of the mold structures 110 by the electrode separation regions ESR. The horizontal semiconductor layer 100 may be exposed to the first and second gate insulation regions GIR1 and GIR2, dummy gate insulation regions DIR, and electrode separation regions ESR. Common source regions CSR may be formed in the horizontal semiconductor layer 100 beneath the first gate insulation regions GIR1. The common source regions CSR may be formed by implanting the horizontal semiconductor layer 100 with impurities having conductivity opposite to that of the horizontal semiconductor layer 100.

In an exemplary embodiment of the present inventive concept, the first gate insulation regions GIR1 may extend substantially parallel to each other in the first direction D1 on the cell array region CAR. When viewed in a plan view, the second gate insulation regions GIR2 may be spaced apart in the first direction D1 from the first gate insulation regions GIR1 across the gate opening OP. The second gate insulation regions GIR2 may have a substantially uniform thickness on the connection region CNR and may extend in the first direction D1 while surrounding the through insulation pattern 200. The second gate insulation regions GIR2 may have first portions spaced apart at a first interval and second portions spaced apart at a second interval less than the first interval. Dummy gate insulation regions DIR may be provided between the first portions spaced apart at the first interval of the second gate insulation regions GIR2.

Referring to FIG. 20B, the second gate insulation regions GIR2 may include portions extending in the second direction D2. Alternatively, referring to FIG. 20C, the second gate insulation regions GIR2 may have a substantially uniform thickness, may extend in the first direction D1, and may include portions separated from each other between the gate openings OP. For example, the second gate insulation regions GIR2 may extend substantially parallel to each other while having different lengths from each other in the first direction D1.

At least one of the electrode separation regions ESR may extend in the first direction D1 on the cell array region CAR, and may include a ring-shape portion surrounding the through insulation pattern 200 on the connection region CNR. Another one of the electrode separation regions ESR may continuously extend along the first direction D1 from the cell array region CAR toward the connection region CNR.

Referring to FIGS. 20B and 20C, when the first and second gate insulation regions GIR1 and GIR2, the dummy gate insulation regions DIR, and the electrode separation regions ESR are formed to expose the horizontal semiconductor layer 100, the lower insulating layer SL1 may be separated into a plurality of lines extending in the first direction D1 (see, e.g., FIGS. 8 and 14). The first and second gate insulation regions GIR1 and GIR2, the dummy gate insulation regions DIR, and the electrode separation regions ESR may expose sidewalls of the lower sacrificial layer SL1, the lower insulating layer ILD11, and the mold structure 110.

Figure 21:
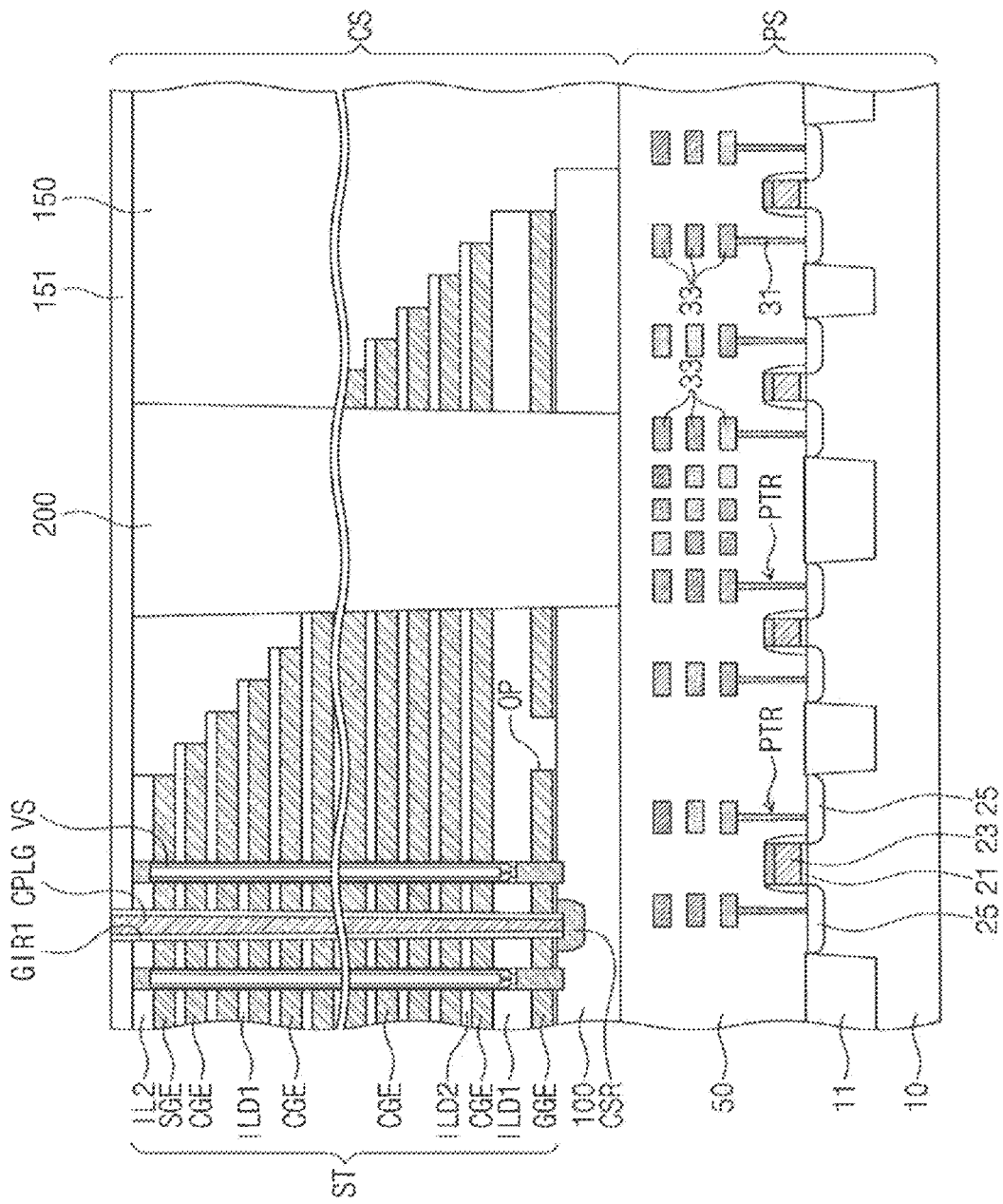

Referring to FIG. 21, a replacement process may be performed such that electrodes GGE, CGE, and SGE may replace the lower sacrificial layer SL1 and the upper sacrificial layers SL2 exposed to the first and second gate insulation regions GIR1 and GIR2, the dummy gate insulation regions DIR, and the electrode separation regions ESR, thus forming an electrode structure ST.

For example, gate cavities 15 (see, e.g., FIG. 7A) may be formed between the lower and upper insulating layers ILD1 and ILD2 by removing the lower sacrificial layer SL1 and the upper sacrificial layers SL2 exposed to the first and second gate insulation regions GIR1 and GIR2, the dummy gate insulation regions DIR, and the electrode separation regions ESR. The lower sacrificial layer SL1 and the upper sacrificial layers SL2 may be isotropically etched using an etching recipe that exhibits an etch selectivity to the lower and upper insulating layers ILD1 and ILD2, the vertical structures VS, and the horizontal semiconductor layer 100. The gate cavities 15 may horizontally extend between the lower and upper insulating layers ILD11 and ILD2, and may partially expose sidewalls of the vertical structures VS.

Horizontal insulating patterns HP and electrodes GGE, CGE, and SGE may be formed in the gate cavities 15. For example, the horizontal insulating patterns HP and the electrodes GGE, CGE, and SGE may be formed by sequentially depositing a horizontal insulating layer, a barrier metal layer (e.g., TiN, TaN, or WN), and a metal layer (e.g., W) on the mold structure 110 in which the gate cavities 15 are formed, and then anisotropically etching the horizontal insulating layer, the barrier metal layer, and the metal layer. The horizontal insulating pattern HP may include a silicon oxide layer or a high-k dielectric layer, serving as a portion of a data storage layer of an NAND Flash memory device.

After the electrodes GGE, CGE, and SGE are formed, an insulating material may be provided to substantially fill the first and second gate insulation regions GIR1 and GIR2, the dummy gate insulation regions DIR, and the electrode separation regions ESR. A common source plug CPLG may be formed in the first gate insulation region GIR1 to come into direct contact with the common source region CSR.

Figure 22:
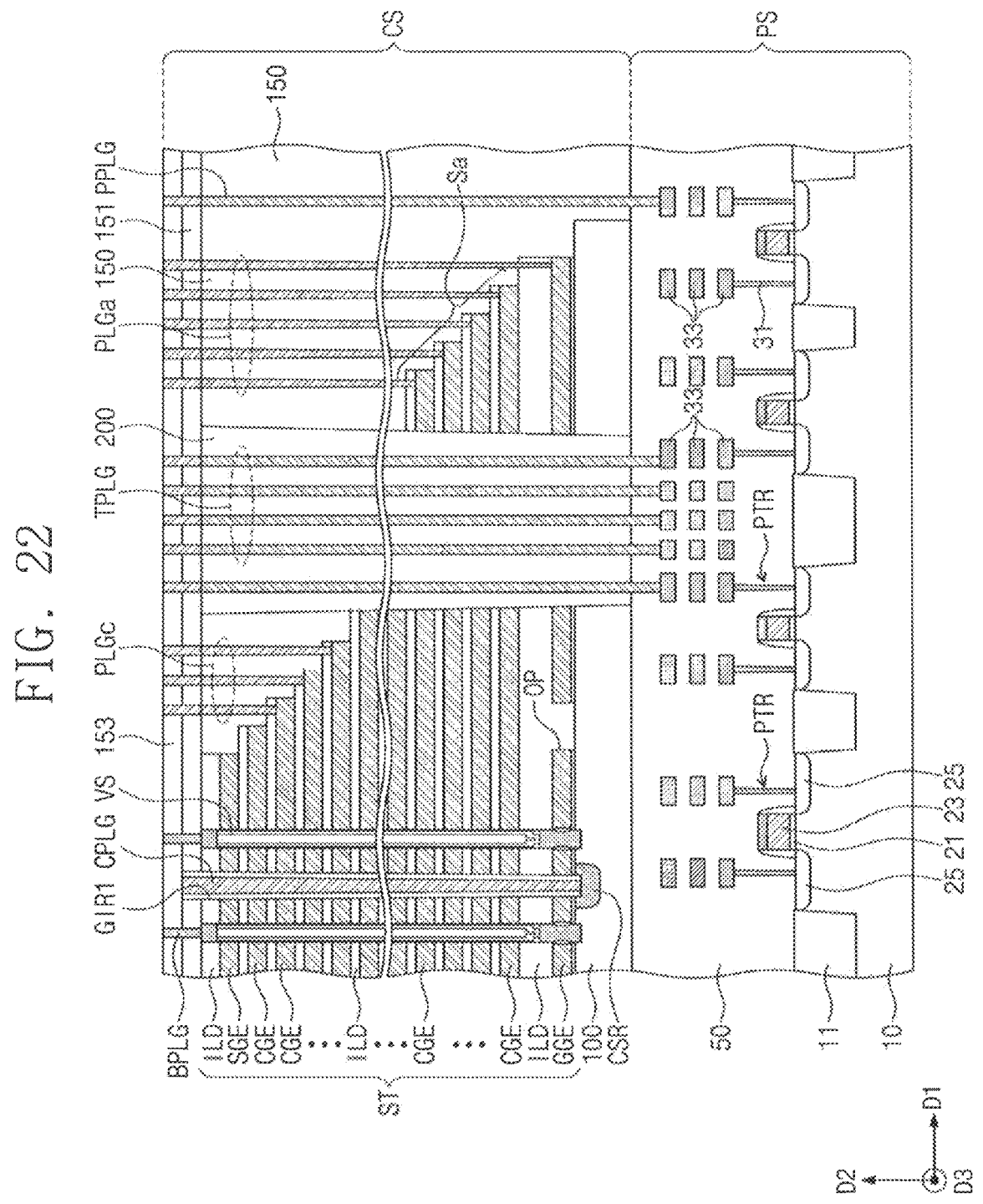

Referring to FIG. 22, the second interlayer dielectric layer 153 may be formed on the first interlayer dielectric layer 151. Bit line contact plugs BPLG may be formed on the cell array region CAR. Lower contact plugs PLGa, intermediate contact plugs PLGb (see, e.g., FIG. 4), and upper contact plugs PLGc may be formed on the connection region CNR to come into direct contact with the electrodes GGE, CGE, and SGE. Through contact plugs TPLG and a connection contact plug PPLG may be formed on the connection region CNR to be connected with (e.g., to be electrically connected with) with the peripheral circuit lines 33 of the peripheral logic structure PS. The through contact plugs TPLG may penetrate the through insulation pattern 200, and the connection contact plug PPLG may penetrate the upper buried insulating layer 150.

According to an exemplary embodiment of the present inventive concept, a three-dimensional semiconductor memory device may include the through via structure that penetrates the stepwise structure of the electrode structure and electrically connects the electrode structure to the peripheral logic structure beneath the electrode structure. The electrodes of the electrode structure may extend while surrounding the through via structure, and the lowermost ground select gate electrodes among the electrodes may be electrically separated from each other.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A three-dimensional semiconductor memory device, comprising:
    a peripheral logic structure on a semiconductor substrate;
    a horizontal semiconductor layer on the peripheral logic structure and including a cell array region and a connection region;
    electrode structures extending in a first direction on the horizontal semiconductor layer and spaced apart in a second direction crossing the first direction, the electrode structures including electrodes vertically stacked on the horizontal semiconductor layer;
    electrode isolation regions disposed between the electrode structures and extending from the cell array region to the connection region;
    gate insulating regions crossing the electrodes of the electrode structures in the first direction;
    an opening crossing at least one of the electrodes of the electrode structures in a second direction and connecting the gate insulation regions;
    an insulating layer filling the opening;
    a through insulation pattern penetrating the horizontal semiconductor layer between two electrode isolation regions adjacent to each other among the electrode isolation regions;
    through plugs penetrating the through insulation pattern and connected to the peripheral logic structure;
    wherein the electrode isolation regions has a length in the first direction longer than the gate insulation regions; and
    wherein the first and second, directions are parallel to a top surface of the semiconductor substrate.

2. The device of claim 1, wherein the opening penetrates a lowermost electrode of the electrodes.

3. The device of claim 1, wherein the insulating layer covers a top surface of a lowermost electrode of the electrodes.

4. The device of claim 1, wherein the insulating layer includes silicon oxide.

5. The device of claim 1, wherein the through plugs are disposed between the gate insulation region and the electrode isolation region.

6. The device of claim 1, wherein the electrode isolation regions extend along paths that are parallel to each other.

7. The device of claim 1, wherein the through plugs electrically connect the electrode structure and the peripheral logic structure.

8. The device of claim 1, further comprising vertical semiconductor patterns vertically penetrating the electrode structure on the substrate of the cell array region.

9. The device of claim 1, further comprising contact plugs respectively connected to the electrodes on the connection area of the substrate.

10. A three-dimensional semiconductor memory device, comprising:

a peripheral logic structure on a semiconductor substrate;

a horizontal semiconductor layer on the peripheral logic structure and including a cell array region and a connection region;

a first electrode structure and a second electrode structure extending in a first direction on the horizontal semiconductor layer, each of the first and second electrode structures comprising electrodes vertically stacked on the horizontal semiconductor layer;

electrode isolation regions disposed between the first and second electrode structures and extending from the cell array region to the connection region;

gate insulating regions crossing the electrodes of the first electrode structure in the first direction;

an opening crossing at least one of the electrodes of the first electrode structure in a second direction crossing the first direction, the opening connected to the gate insulating regions;

an insulating layer filling the opening;

a first through via structure penetrating the first electrode structure and connected to the peripheral logic structure; and a second through via structure penetrating the second electrode structure and connected to the peripheral logic structure, the second through via structure spaced apart from the first through via structure with the electrode isolation regions therebetween;

wherein the electrode isolation regions has a length in the first direction longer than the gate insulation regions; and wherein the first and second, directions are parallel to a top surface of the semiconductor substrate.

11. The device of claim 10, wherein the first through via structure disposed between the gate insulating regions and the electrode isolation region.

12. The device of claim 10, wherein the insulating layer covers a top surface of a lowermost electrode of the electrodes.

13. The device of claim 10, wherein each of the first and second through via structures comprises:

a through insulation pattern extending in a third direction perpendicular to a top surface of the horizontal semiconductor layer and penetrating the horizontal semiconductor layer;

through plugs penetrating the through insulation pattern and connected to the peripheral logic structure.

14. The device of claim 10, wherein the first and second through via structures are located on the connection region.

15. The device of claim 10, wherein the gate insulating regions are located on the connection region.

16. The device of claim 10, wherein the opening is located between the first through via structure and the cell array region.

17. The device of claim 1, further comprising vertical semiconductor patterns vertically penetrating the electrode structure on the substrate of the cell array region.

18. The device of claim 1, further comprising contact plugs respectively connected to the electrodes on the connection area of the substrate.

* * * * *